US012696531B2

(12) United States Patent
Lin et al.

(10) Patent No.: US 12,696,531 B2
(45) Date of Patent: Jul. 28, 2026

(54) SEMICONDUCTOR DEVICE WITH DIELECTRIC LAYER AND METHOD OF FORMING THE SAME

(71) Applicant: Taiwan Semiconductor Manufacturing Co., Ltd., Hsinchu (TW)

(72) Inventors: Cheng-I Lin, Hsinchu (TW); Ming-Ho Lin, Taipei (TW); Da-Yuan Lee, Jhubei (TW); Chi On Chui, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 696 days.

(21) Appl. No.: 17/568,926

(22) Filed: Jan. 5, 2022

(65) Prior Publication Data

US 2023/0008994 A1    Jan. 12, 2023

Related U.S. Application Data

(60) Provisional application No. 63/219,905, filed on Jul. 9, 2021.

(51) Int. Cl.
| | |
|---|---|
| *H10D 84/83* | (2025.01) |
| *H10D 30/01* | (2025.01) |
| *H10D 30/62* | (2025.01) |
| *H10D 64/01* | (2025.01) |
| *H10D 84/01* | (2026.01) |

(Continued)

(52) U.S. Cl.
CPC ......... *H10D 84/834* (2025.01); *H10D 30/024* (2025.01); *H10D 30/6211* (2025.01); *H10D 64/017* (2025.01); *H10D 84/0158* (2025.01); *H10D 84/038* (2025.01); *H10P 14/60* (2026.01);

(Continued)

(58) Field of Classification Search
CPC ......... H01L 21/823468; H01L 29/6656; H01L 29/66795; H01L 29/785; H01L 29/7851; H01L 29/66545; H01L 21/02323; H01L 21/0334; H01L 27/0886; H01L 21/823431; H01L 21/28185; H01L 21/3115; H01L 21/31662; H01L 21/28211; H01L 21/28229; H10D 84/834; H10D 30/024; H10D 30/6211; H10D 84/0158; H10D 30/62; H10P 14/6905; H10P 14/6518–6522; H10P 14/6329; H10P 14/6319; H10P 14/6528; H10P 14/6532
See application file for complete search history.

(56) References Cited

U.S. PATENT DOCUMENTS 9,093,530 B2    7/2015  Huang et al.
9,171,929 B2    10/2015  Lee et al.

(Continued)

*Primary Examiner* — Julio J Maldonado
*Assistant Examiner* — Nathan Pridemore
(74) *Attorney, Agent, or Firm* — Slater Matsil, LLP

(57) ABSTRACT

A method of forming a semiconductor device includes forming a first layer over a semiconductor fin and forming a second layer over the first layer. The first layer is a first material and the second layer is a second material different from the first layer. The second layer is thicker on a top of the semiconductor fin than along a sidewall of the semiconductor fin. The method further includes performing an oxidation process, the oxidation process oxidizing at least a portion of the second layer, and patterning the second layer and the first layer.

19 Claims, 30 Drawing Sheets

(51) Int. Cl.
    *H10D 84/03*         (2025.01)
    *H10P 14/60*         (2026.01)
    *H10P 95/00*         (2026.01)

(52) U.S. Cl.
    CPC .......... *H10P 14/6304* (2026.01); *H10P 95/00*
               (2026.01); *H10D 30/62* (2025.01)

(56)                References Cited

U.S. PATENT DOCUMENTS

| | | | |
|---|---|---|---|
| 9,214,555 B2 | 12/2015 | Oxland et al. | |
| 9,236,267 B2 | 1/2016 | De et al. | |
| 9,520,482 B1 | 12/2016 | Chang et al. | |
| 9,548,303 B2 | 1/2017 | Lee et al. | |
| 9,564,435 B2 * | 2/2017 | Chung | H01L 27/0886 |
| 9,564,489 B2 | 2/2017 | Yeo et al. | |
| 9,576,814 B2 | 2/2017 | Wu et al. | |
| 9,601,342 B2 | 3/2017 | Lee et al. | |
| 9,608,116 B2 | 3/2017 | Ching et al. | |
| 9,984,933 B1 * | 5/2018 | Xu | H01L 21/845 |
| 10,128,156 B1 * | 11/2018 | Chiang | H10D 84/0158 |
| 2018/0166560 A1 * | 6/2018 | Chiang | H01L 21/82345 |
| 2018/0315835 A1 * | 11/2018 | Cheng | H01L 29/7827 |
| 2019/0355823 A1 * | 11/2019 | Lin | H10D 30/62 |

* cited by examiner

600

600

SEMICONDUCTOR DEVICE WITH DIELECTRIC LAYER AND METHOD OF FORMING THE SAME

PRIORITY CLAIM AND CROSS-REFERENCE

This application claims the benefit of U.S. Provisional Application No. 63/219,905, filed on Jul. 9, 2021, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
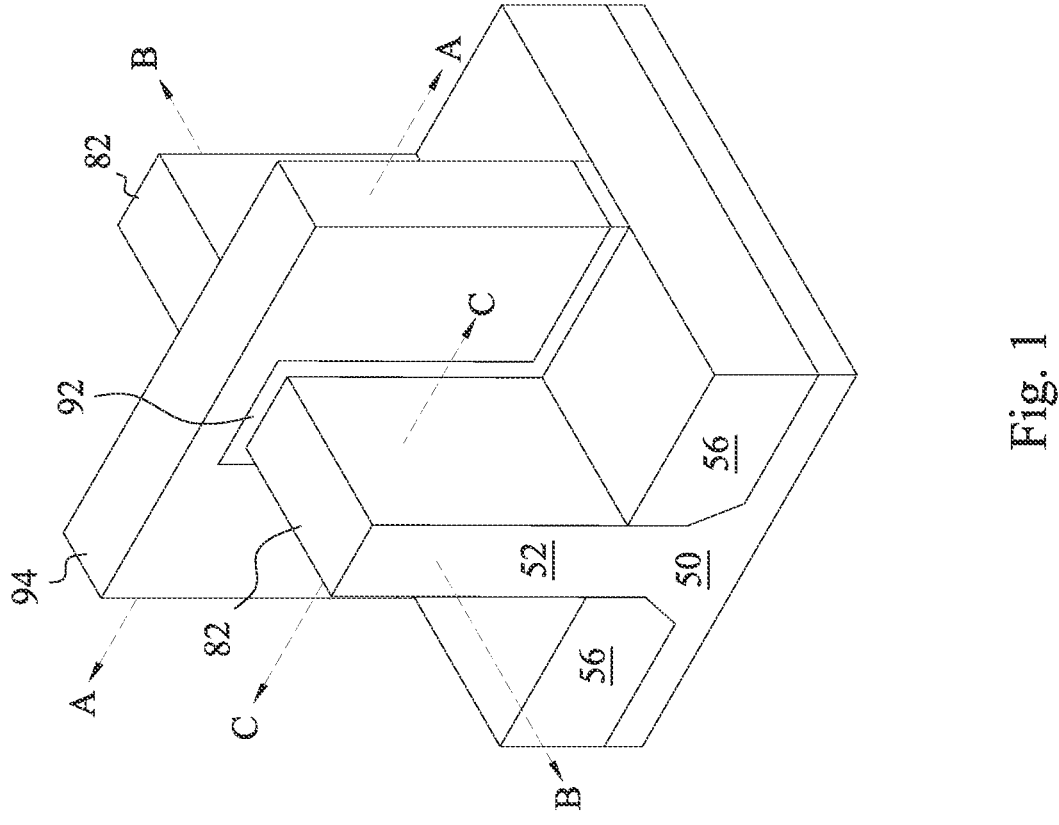
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to some embodiments, a dielectric layer is formed over semiconductor features, e.g. fins, prior to forming dummy gates over the fins. Using a process comprising, e.g., physical vapor deposition and a subsequent oxidation, a greater thickness of dielectric material is formed over tops of the fins than over sidewalls of the fins. The dielectric layer may reduce fin loss from the top surface of the fins during subsequent patterning processes of the dummy gates, which may boost device performance by reducing contact resistance. The process to form the dielectric layer can be integrated with a standard process flow and may achieve low cost and high rates of wafers per hour (WPM).

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs, nanostructure (e.g., nanosheet, nanowire, gate-all-around, or the like) field effect transistors (NSFETs), or the like.

FIGS. 2 through 21D are cross-sectional views of intermediate stages in the manufacturing of FinFETs, in accordance with some embodiments. FIGS. 2 through 8A and 9 illustrate reference cross-section A-A illustrated in FIG. 1, except for multiple fins/FinFETs. FIGS. 10A, 11A, 12A, 13A, 14A, 15A, 16A, 17A, 18A, 18C, 19A, 19D, 20A, 20C, 21A, and 21C are illustrated along reference cross-section A-A illustrated in FIG. 1, and FIGS. 10B, 11B, 12B, 13B, 14B, 15B, 16B, 17B, 18B, 18D, 19B, 19C, 19E, 19F, 20B, 20D, 21B, and 21D are illustrated along a similar cross-section B-B illustrated in FIG. 1, except for multiple fins/ FinFETs. FIGS. 15C and 15D are illustrated along reference cross-section C-C illustrated in FIG. 1, except for multiple fins/FinFETs.

Figure 2:
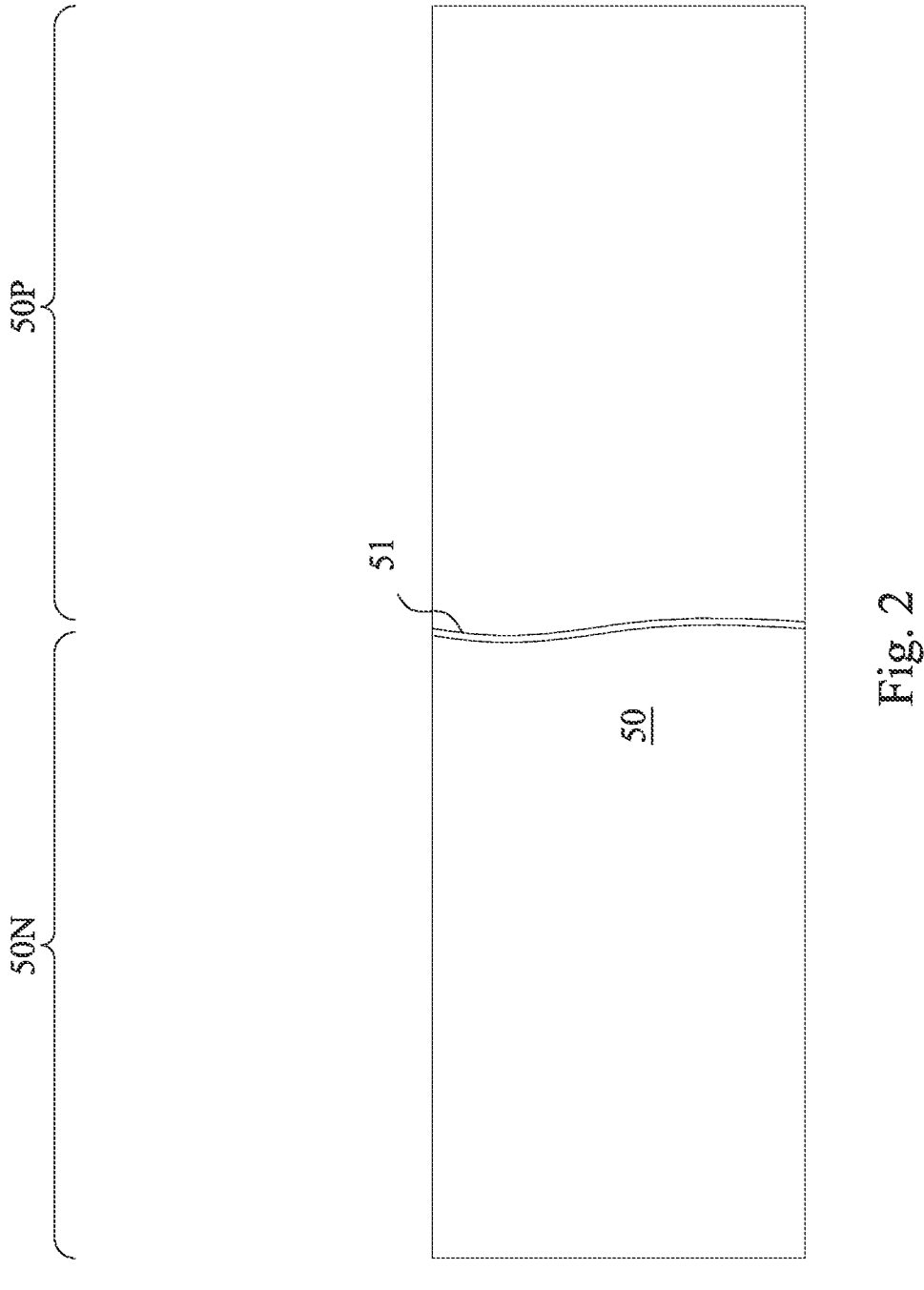
FIGS. 2, 3, 4, 5, 6, 7, 8A, 9, 10A, 10B, 11A, 11B, 12A, 12B, 13A, 13B, 14A, 14B, 15A, 15B, 15C, 15D, 16A, 16B, 17A, 17B, 18A, 18B, 18C, 18D, 19A, 19B, 19C, 19D, 19E, 19F, 20A, 20B, 20C, 20D, 21A, 21B, 21C, and 21D are cross-sectional views of intermediate stages in the manufacturing of FinFETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type FinFETs. The p-type region 50P can be for forming p-type devices, such as PMOS transistors, e.g., p-type FinFETs. The n-type region 50N may be physically separated from the p-type region 50P (as illustrated by divider 51), and any number of device features (e.g., other active devices, doped regions, isolation structures, etc.) may be disposed between the n-type region 50N and the p-type region 50P.

Figure 3:
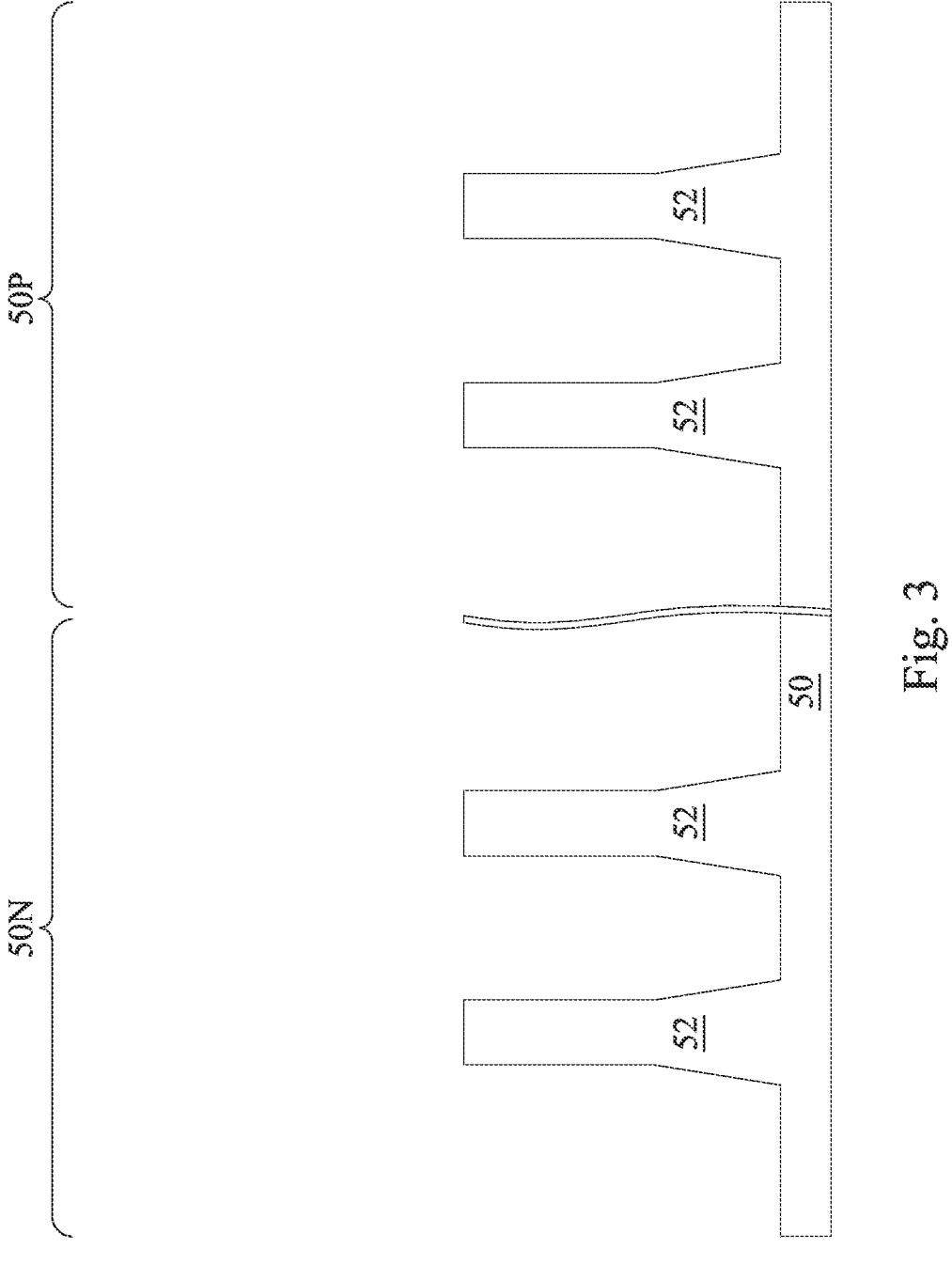

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

Figure 4:
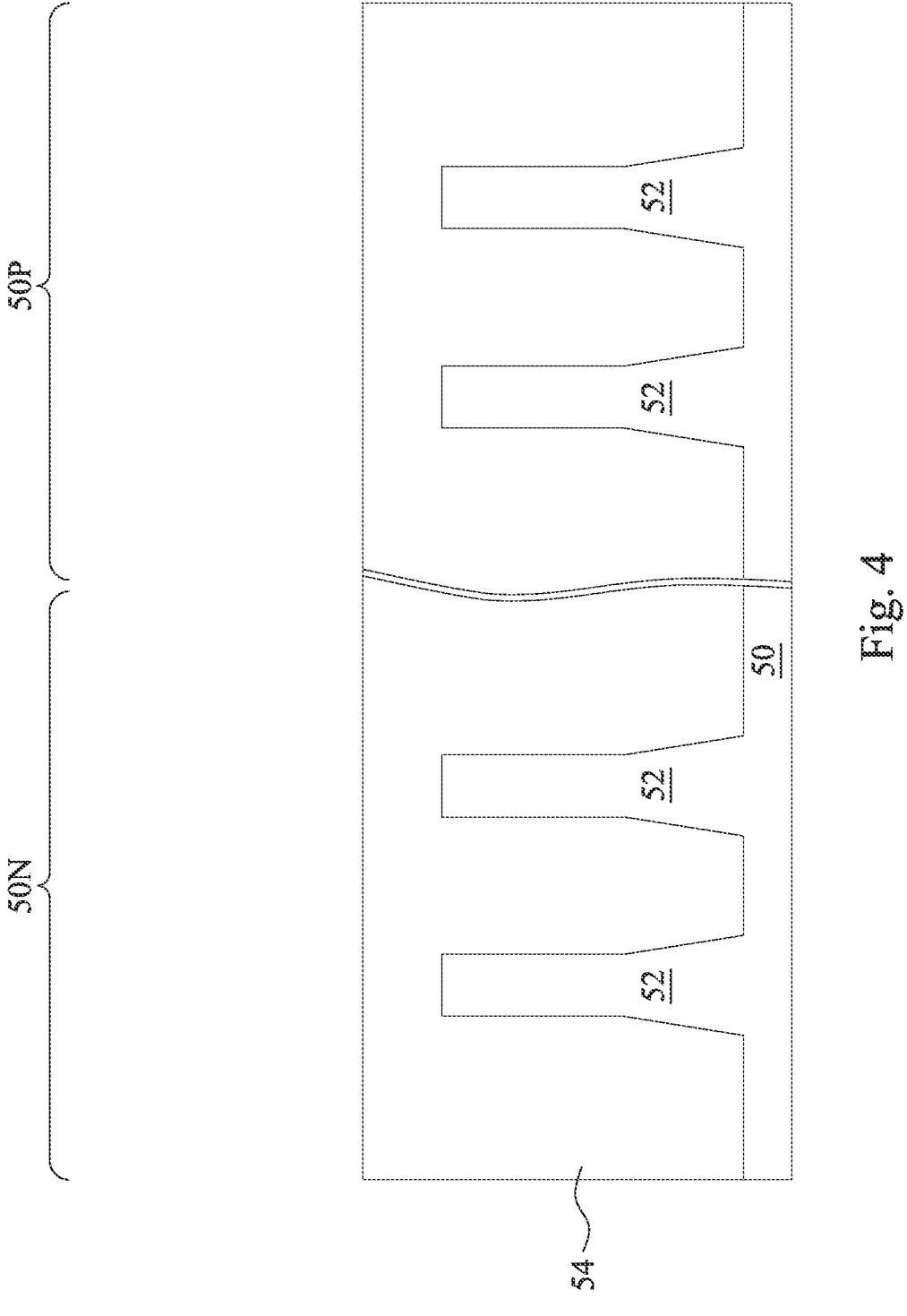

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 5:
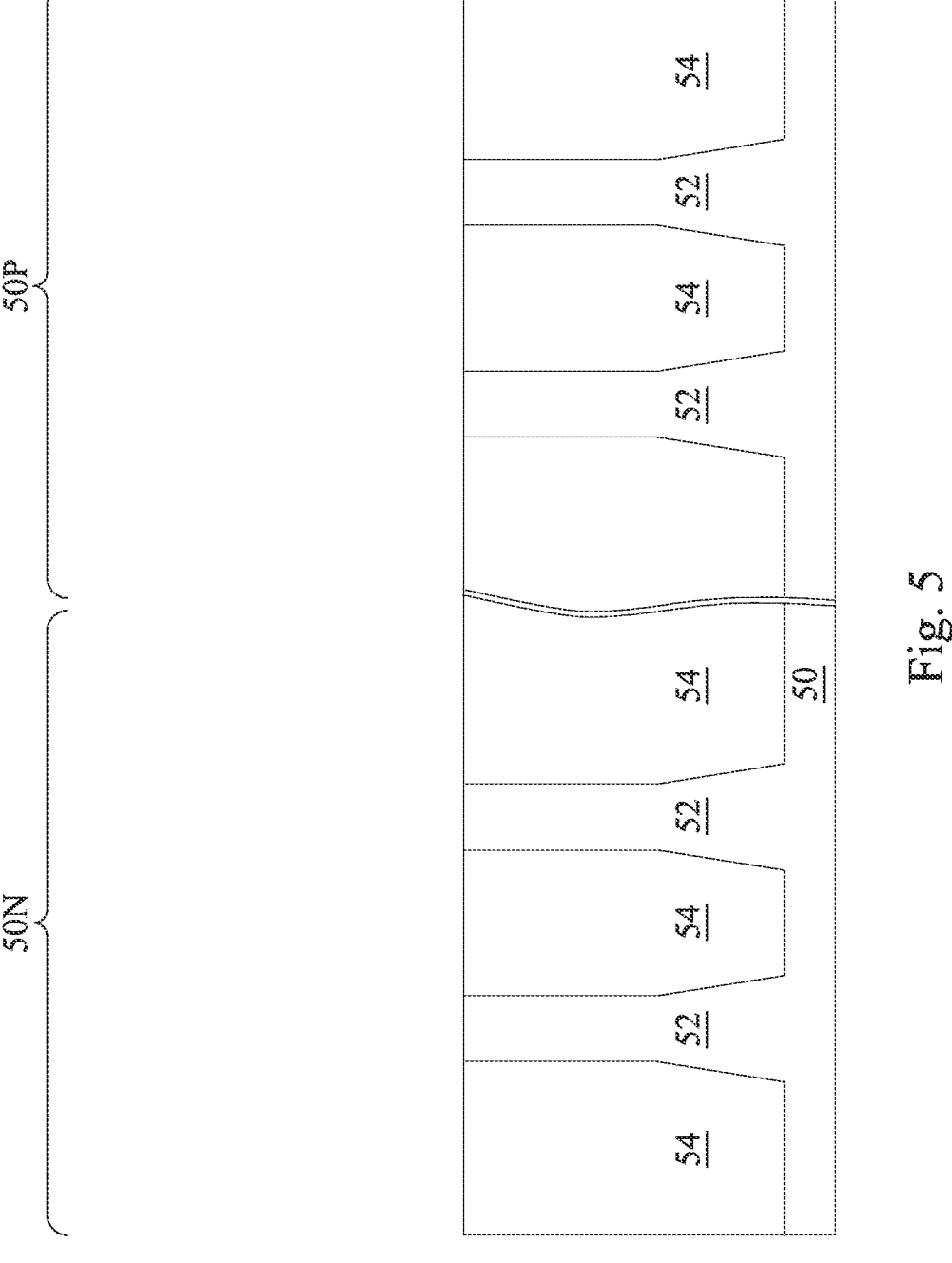

In FIG. 5, a removal process is applied to the insulation material 54 to remove excess insulation material 54 over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material 54 are level after the planarization process is complete. In embodiments in which a mask remains on the fins 52, the planarization process may expose the mask or remove the mask such that top surfaces of the mask or the fins 52, respectively, and the insulation material 54 are level after the planarization process is complete.

Figure 6:
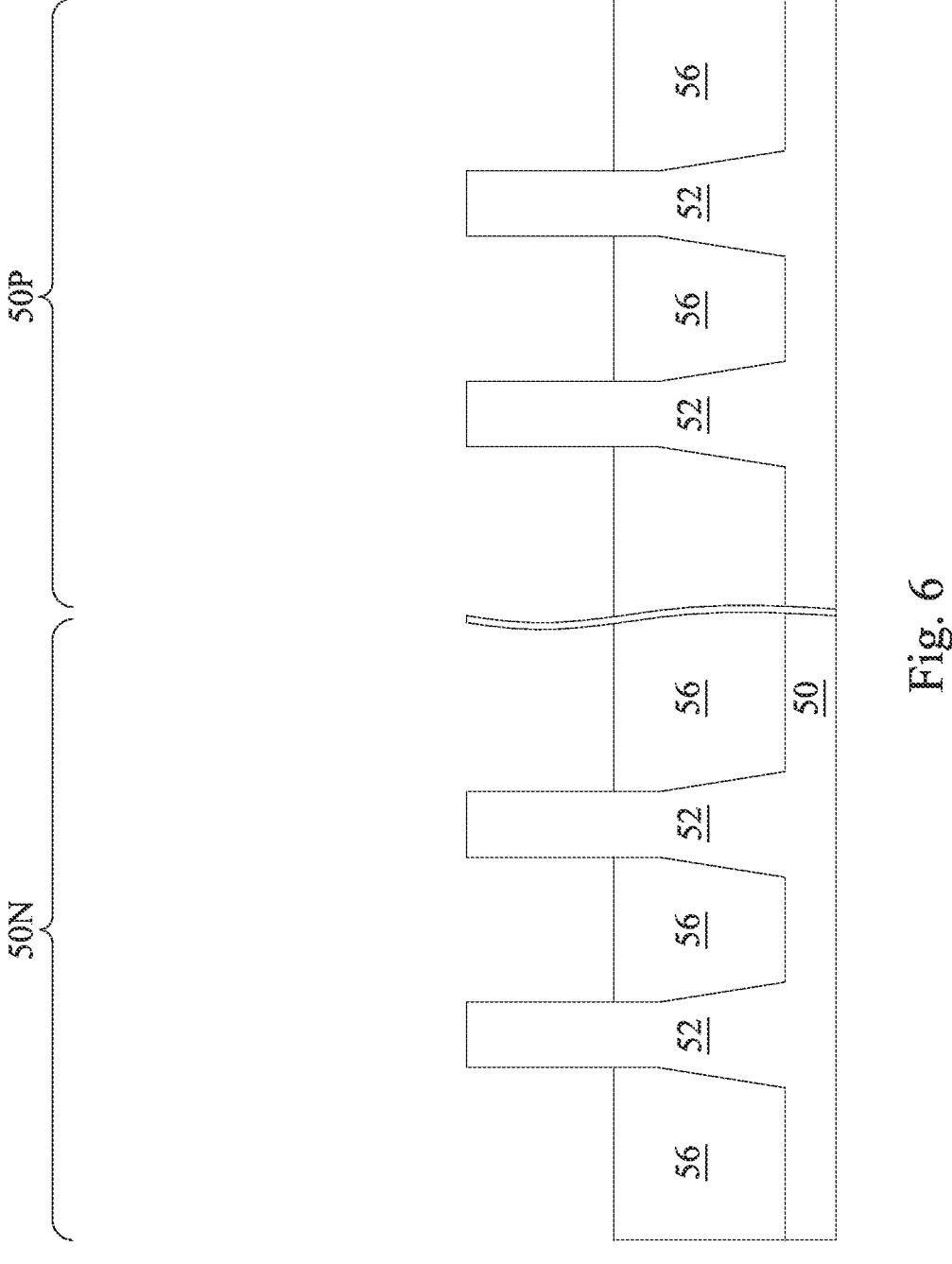

In FIG. 6, the insulation material 54 is recessed to form Shallow Trench Isolation (STI) regions 56. The insulation material 54 is recessed such that upper portions of fins 52 in the n-type region 50N and in the p-type region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, an oxide removal using, for example, dilute hydrofluoric (dHF) acid may be used.

In some embodiments, a protective cap (not shown) may be formed to protect a surface of the fins 52 during subsequent processes. For example, a protective cap may be desirable if the fins 52 comprise silicon-germanium. Silicon germanium may oxidize at a higher rate than, for example, silicon during subsequent processes. Thus, in embodiments in which the fins 52 comprise silicon-germanium, protective caps formed of another material (such as silicon) may be formed over the silicon germanium of the fins 52, thus preventing the fins 52 from oxidizing as much. The protective caps may be a semiconductor material, such as silicon, silicon carbide, a III-V compound semiconductor, a II-VI compound semiconductor, or the like. In some embodiments, the protective caps are silicon and are epitaxially grown on the exposed portions of the fins 52. After forming the protective caps, an anneal, e.g. a thermal anneal, may be performed on the protective caps to reduce structural defects in the protective caps.

The process described with respect to FIGS. 2 through 6 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in n-type region 50N (e.g., an NMOS region) different from the material in p-type region 50P (e.g., a PMOS region). In various embodiments, upper portions of the fins 52 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 6, appropriate wells (not shown) may be formed in the fins 52 and/or the substrate 50. In some embodiments, a P well may be formed in the n-type region 50N, and an N well may be formed in the p-type region 50P. In some embodiments, a P well or an N well are formed in both the n-type region 50N and the p-type region 50P.

In the embodiments with different well types, the different implant steps for the n-type region 50N and the p-type region 50P may be achieved using a photoresist and/or other masks (not shown). For example, a photoresist may be formed over the fins 52 and the STI regions 56 in the n-type region 50N. The photoresist is patterned to expose the p-type region 50P of the substrate 50. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist is removed, such as by an acceptable ashing process.

Following the implantation of the p-type region 50P, a photoresist is formed over the fins 52 and the STI regions 56 in the p-type region 50P. The photoresist is patterned to expose the n-type region 50N of the substrate 50. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist may be removed, such as by an acceptable ashing process.

After the implantation of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 7:
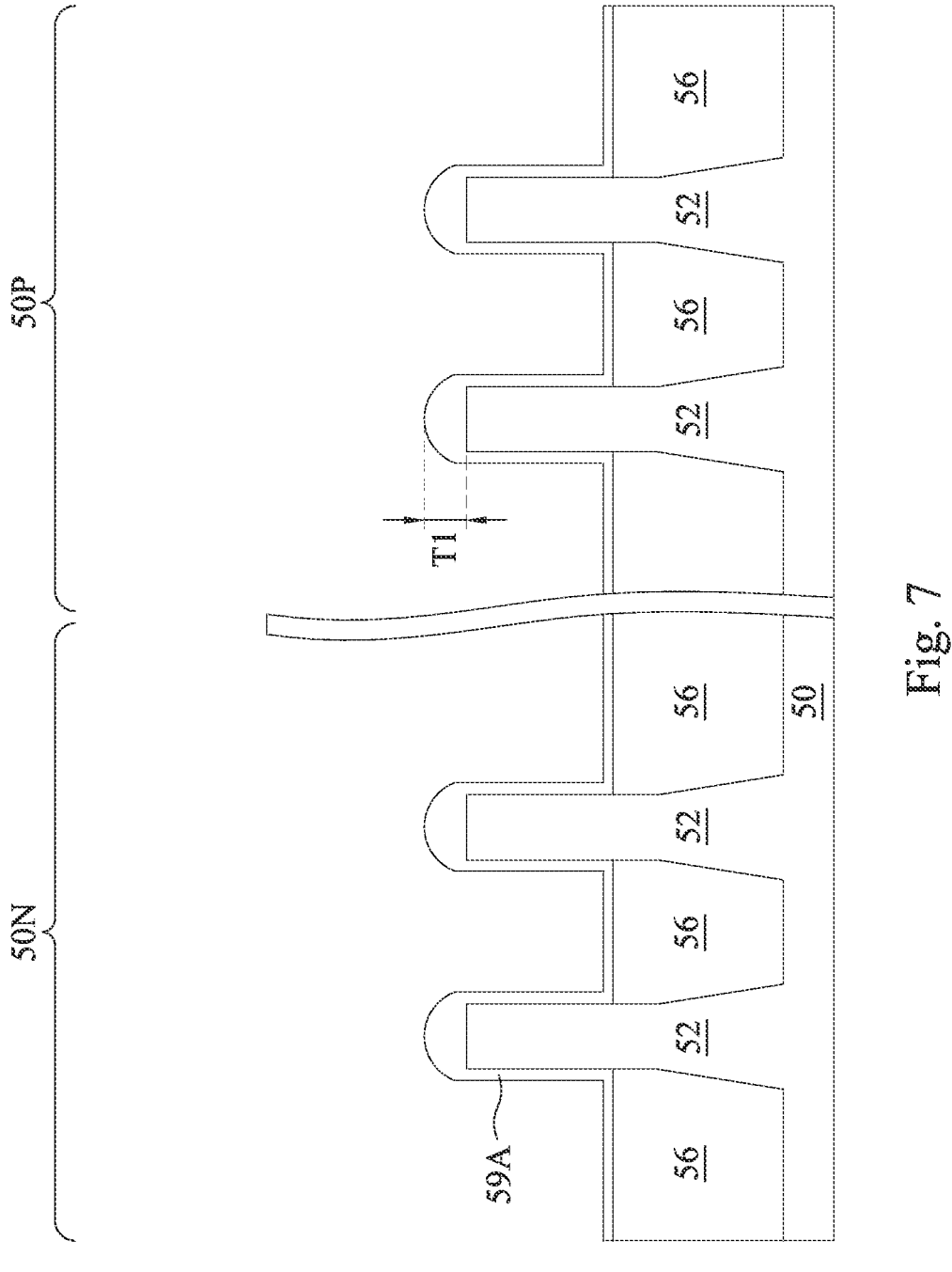
Figure 8A:
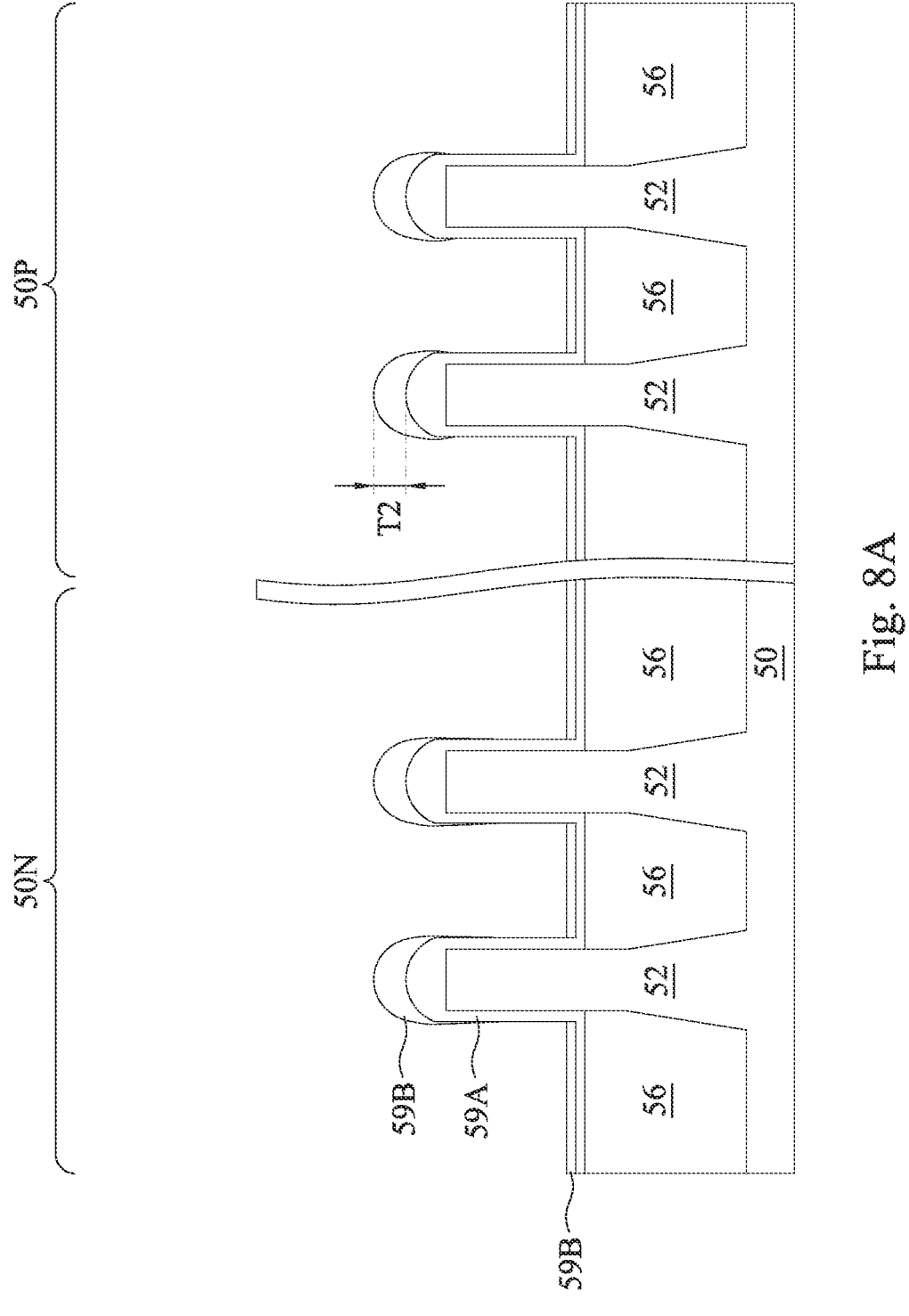
Figure 8B:
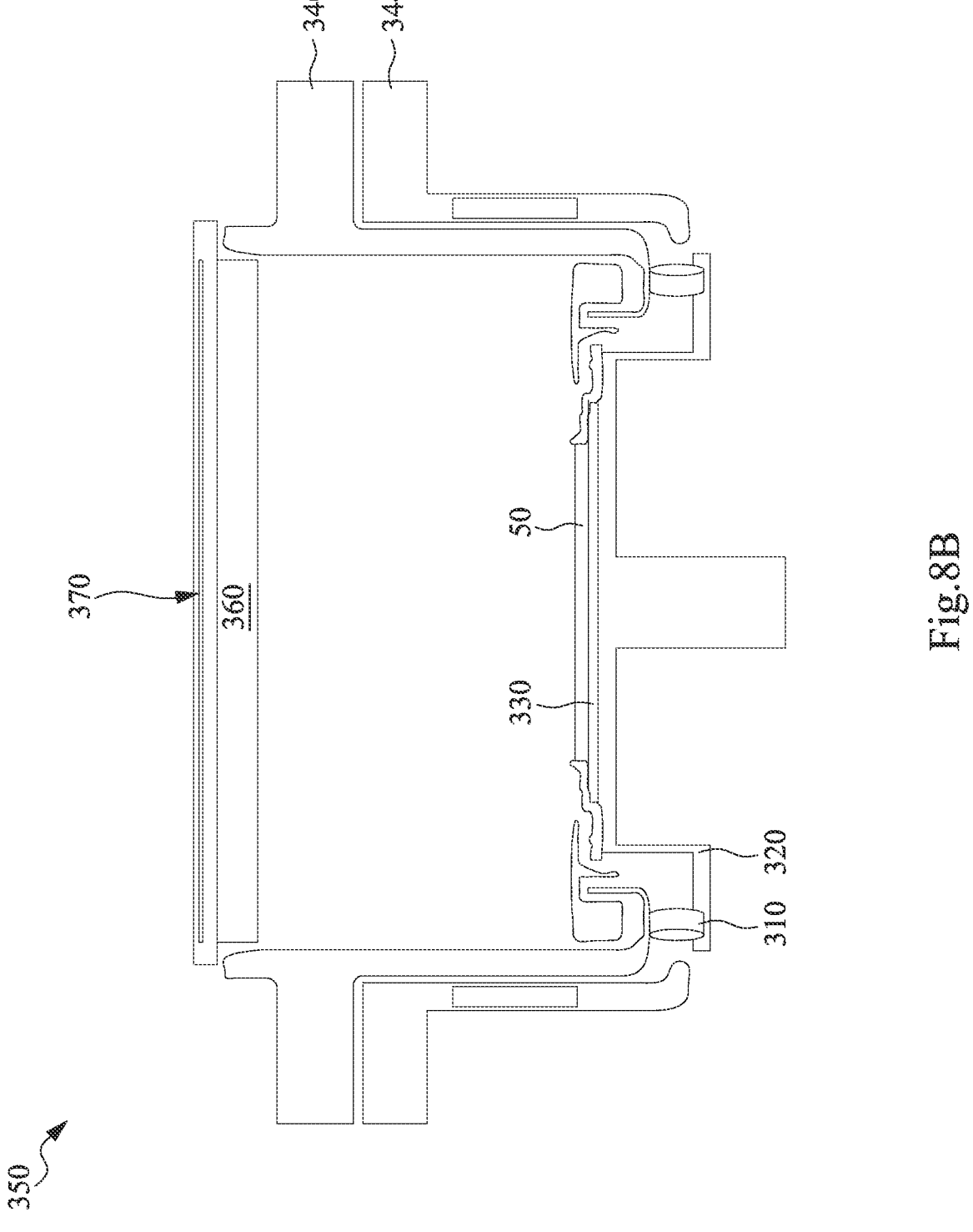
FIG. 8B illustrates a cross-sectional view of a process chamber, in accordance with some embodiments.
Figure 9:
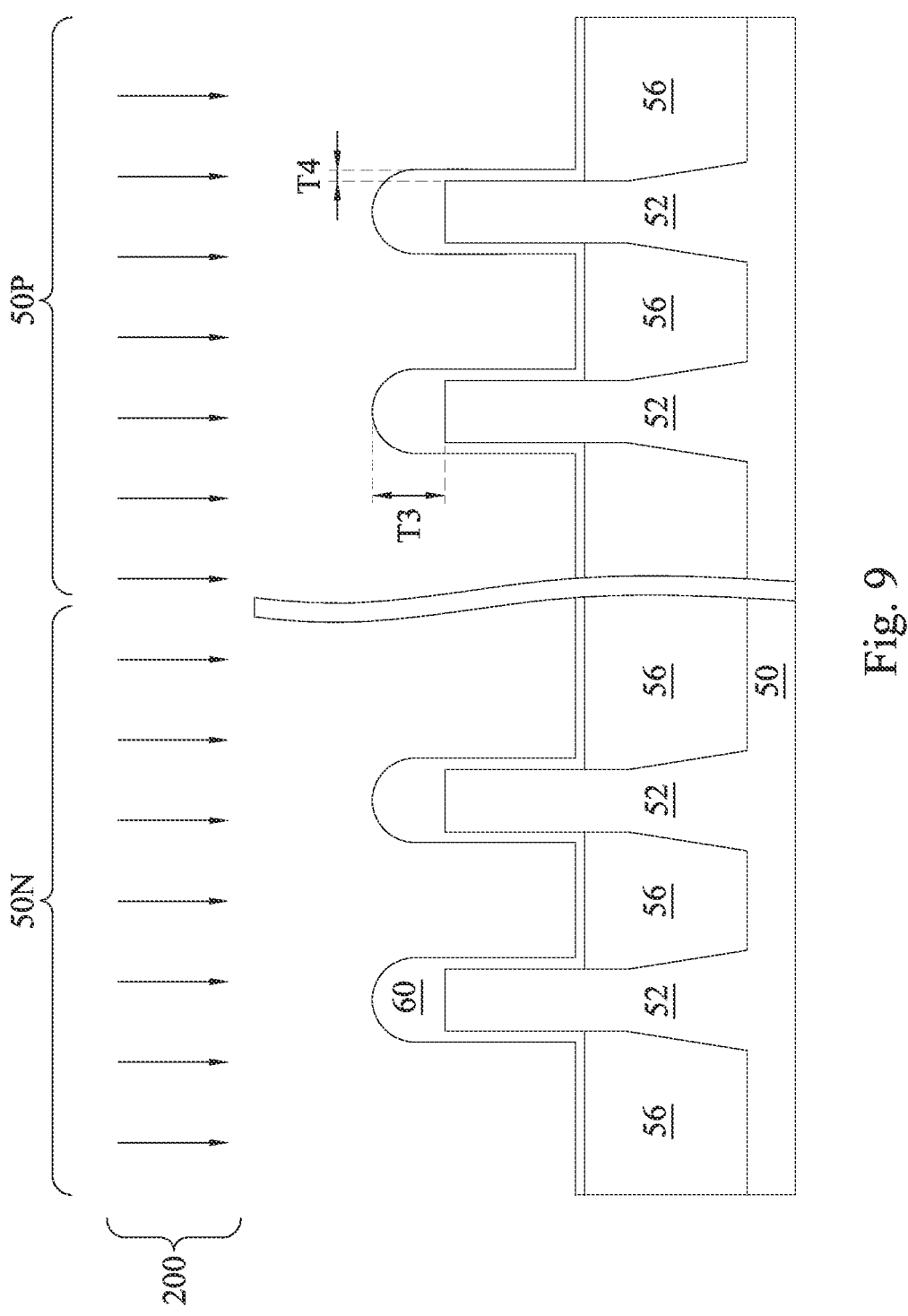

FIGS. 7 through 9 illustrate the formation of a dummy dielectric layer 60 (see below, FIG. 9) over the fins 52, in accordance with some embodiments. The dummy dielectric layer 60 has a greater thickness of dielectric material formed over the top of the fins 52 than over sidewalls of the fins 52. The greater thickness on the top of the dummy dielectric layer 60 may reduce fin loss from the top surface of the fins 52 during subsequent removal processes of dummy gates formed over the fins 52 (see below, FIGS. 12A and 12B) without increasing the thickness of the dummy dielectric layer 60 on sidewalls of the fins 52, which may lead to undesired merging of subsequently formed portions of the dummy dielectric layer 60 on adjacent fins 52 and/or undesired voids in subsequently formed portions of a dummy gate layer (see below, FIGS. 10A and 10B) between adjacent fins 52. Because the process to form the dummy dielectric layer 60 can be integrated with a standard process flow, the process to form the dummy dielectric layer 60 is low cost and may achieve high rates of wafers per hour (WPH).

Referring first to FIG. 7, a first layer 59A is formed over the fins 52 and over exposed portions of the STI regions 56. The first layer 59A may comprise the bulk of the portions of the subsequently formed dummy dielectric layer 60 on sidewalls of the fins 52. The first layer 59A may comprise one or more oxide (e.g., silicon oxide) and/or nitride (e.g., silicon nitride) layers and may be formed by a suitable process such as CVD, PECVD, PVD, ALD, PEALD, or the like. In some embodiments, the first layer 59A comprises silicon oxide formed by PEALD with a plasma generation power in a range of 300 W to 500 W. In some embodiments, the first layer 59A is formed to a first thickness T1 over an upper surfaces of the fins 52 in a range of 15 Å to 40 Å, which is advantageous for reducing fin loss during a subsequent patterning process of a dummy gate (see below, FIGS. 11A-12B). Forming the first layer 59A to a thickness less than 15 Å may lead to undesired fin loss during the subsequent patterning process of the dummy gate. Forming the first layer 59A to a thickness greater than 40 Å may lead to undesired merging of subsequently formed portions of the dummy dielectric layer 60 on adjacent fins 52 and/or undesired voids in subsequently formed portions of a dummy gate layer (see below, FIGS. 10A-10B) between adjacent fins 52.

In FIGS. 8A and 8B, a second layer 59B is formed on the first layer 59A over the upper surfaces of the fins 52. As discussed in greater detail below, an oxidation process is performed on the combined layers of the first layer 59A and the second layer 59B, thereby forming the dummy dielectric layer 60 (see below, FIG. 9). The second layer 59B is primarily formed over the upper surfaces of the fins 52 such that the combined thickness of the first layer 59A and the second layer 59B is greater over the fins 52 than along sidewalls of the fins 52 or over the STI regions 56, which increases the thickness of portions of a subsequently formed dummy dielectric layer 60 (see below, FIG. 9) over top surfaces of the fins 52 without a corresponding increase in thickness on sidewalls of the fins 52. FIG. 8B illustrates an example treatment chamber 350 in which the second layer 59B may be formed on the first layer 59A using a suitable deposition process such as physical vapor deposition (PVD), sputter deposition, or the like. In some embodiments, the treatment chamber 350 comprises a grounding strip 310, a grounding bracket 320, an electrostatic chuck 330 comprising a bottom electrode (not illustrated), a first shield 340, a second shield 344, a target 360, and a top electrode 370 above the target 360. In some embodiments, the target 360 comprises silicon (e.g. a silicon wafer), silicon oxide or dioxide, silicon nitride, silicon carbide, silicon carbonitride, silicon oxycarbonitride, the like, or a combination thereof. The substrate 50 is disposed on the electrostatic chuck 330 with the first layer 59A exposed on its top surface.

As an example of forming the second layer 59B, a sputtering gas such as argon, neon, carbon dioxide, the like, or a combination thereof is flowed into the deposition chamber, excited to a plasma state. Ions from the plasma collide with the target 360 and atoms ejected from the target 360 may be anisotropically deposited on top surfaces of the first layer 59A over the fins 52 and over the STI regions 56 to form the second layer 59B. In some embodiments, the second layer 59B formed by bombardment by atoms ejected from the target 360 comprises silicon, silicon oxide or dioxide, silicon nitride, silicon carbide, silicon carbonitride, silicon oxycarbonitride, the like, or a combination thereof. In some embodiments, the second layer 59B is a different material from the material of the first layer 59A, e.g. the second layer 59B is substantially silicon and the first layer 59A is substantially silicon oxide or dioxide.

Due to the geometry of the fins 52 and the bombardment of atoms from the target, the second layer 59B may be deposited to a second thickness T2 in a range of 5 Å to 25 Å over top surfaces of the first layer 59A on the fins 52. In some embodiments, portions of the second layer 59B formed on upper sidewalls of the first layer 59A taper in thickness so that bottom portions of the lower sidewalls of the first layer 59A are exposed and the thickness of the second layer 59B increases as the second layer 59B extends farther from the substrate 50. In some embodiments, a thickness of the second layer 59B formed on sidewalls of the first layer 59A may be 2 Å or less, such as in a range of 1 Å to 2 Å.

Forming the second layer 59B to the second thickness T2 over top surfaces of the first layer 59A on the fins 52 in a range of 5 Å to 25 Å may be advantageous for reducing fin loss during a subsequent patterning process of a dummy gate (see below, FIGS. 11A-12B). Forming the second layer 59B to a thickness less than 5 Å may be disadvantageous by not providing sufficient thickness to reduce fin loss during a subsequent patterning process of a dummy gate. Forming the second layer 59B to a thickness greater than 25 Å may be disadvantageous by leading to undesired merging of the second layer 59B on adjacent fins 52 and/or undesired voids in subsequently formed portions of a dummy gate layer (see below, FIGS. 11A-B) between adjacent fins 52.

In some embodiments, the deposition of the second layer 59B is performed at a process temperature in a range of 350°

C. and 450° C. In some embodiments, the deposition of the second layer 59B is performed with a chamber pressure in a range of 0.1 mtorr and 10 mtorr. In some embodiments, the deposition of the second layer 59B is performed over a processing time in a range of 2 seconds and 20 seconds. In some embodiments, the deposition of the second layer 59B is performed using a DC plasma power (as measured at the power supply) in a range of 1 KW and 3 KW applied between the bottom electrode of the electrostatic chuck 330 and the top electrode 370 to direct the ions from the sputtering gas plasma into colliding with the bottom surface of the target 360.

In FIG. 9, an optional oxidation process 200 is performed to oxidize the first layer 59A and/or the second layer 59B to form a dummy dielectric layer 60 with thicker portions over top surfaces of the fins 52 than on sidewalls of the fins 52. The oxidation of the first layer 59A and/or the second layer 59B may reduce or remove impurities, such as carbon or nitrogen atoms, and convert the first layer 59A and/or the second layer 59B to silicon oxide or silicon dioxide. As such, the second layer 59B may have a first etch rate prior to performing the oxidation process 200 and a second etch rate after performing the oxidation process 200 with the second etch rate being similar to an etch rate of the first layer 59A, allowing for a simpler subsequent etch process. For example, in some embodiments where the second layer 59B is silicon nitride, silicon carbide, or silicon carbonitride, carbon and nitrogen atoms may be removed by the oxidation process 200 and replaced with oxygen atoms. In some embodiments, the second layer 59B is silicon and the oxidation process 200 converts the second layer 59B to silicon oxide or silicon dioxide. Converting the second layer 59B to silicon oxide or silicon dioxide may be useful for providing a similar etching selectivity as the first layer 59A during subsequent patterning processes of the dummy dielectric layer 60 (see below, FIGS. 12A-B). In some embodiments, such as embodiments in which the first layer 59A and the second layer 59B comprises silicon oxide or silicon dioxide, the oxidation process 200 may be omitted. After the oxidation process 200, the oxidized second layer 59B may have impurities of atoms other than silicon or oxygen in a range of 0.01% to 0.1%.

The oxidation process 200 may be a treatment with $O_2$ gas, ozone, or oxygen plasma, a thermal oxidation, the like, or a combination thereof. In some embodiments, the oxidation process 200 is a plasma oxidation performed at a temperature in a range of 400° C. to 500° C., at a pressure in a range of 10 mtorr to 100 mtorr, and using a flow rate of $O_2$ in a range of 100 standard cubic centimeters per minute (sccm) to 300 sccm.

In some embodiments, the dummy dielectric layer 60 has a third thickness T3 measured between a top surface of the fins 52 and a top surface of the dummy dielectric layer 60 over the fins 52 in a range of 35 Å to 60 Å, which may be advantageous for reducing fin loss during a subsequent patterning process of a dummy gate (see below, FIGS. 11A-12B). The dummy dielectric layer 60 having a third thickness T3 less than 35 Å may lead to undesired fin loss during the subsequent patterning process of the dummy gate. The dummy dielectric layer 60 having a third thickness T3 greater than 60 Å may decrease the process window for subsequent processes such as dummy gate formation.

In some embodiments, the dummy dielectric layer 60 has a fourth thickness T4 in a range of 15 Å to 40 Å on sidewalls of the fins 52, which may be advantageous for increasing the process window for subsequent processes such as dummy gate formation. The dummy dielectric layer 60 having a fourth thickness T4 less than 15 Å may lead to undesired fin loss during the subsequent patterning process of the dummy gate. The dummy dielectric layer 60 having a fourth thickness T4 greater than 40 Å may lead to undesired merging of the dummy dielectric layer 60 on adjacent fins 52 and/or undesired voids in subsequently formed portions of a dummy gate layer (see below, FIGS. 11A-B) between adjacent fins 52.

In some embodiments, the ratio of the third thickness T3 to the fourth thickness T4 is in a range of 2:1 to 5:1, which may be advantageous for reducing fin loss from the top surfaces of the fins 52 while increasing the process window for subsequent processes such as dummy gate formation. The ratio of the third thickness T3 to the fourth thickness T4 being less than 2:1 may lead to undesired fin loss from the top surfaces of the fins 52 or to a decrease in the process window for subsequent processes such as dummy gate formation. The ratio of the third thickness T3 to the fourth thickness T4 being greater than 5:1 may lead to undesired fin loss on sidewalls of the fins 52 during a subsequent removal process of the dummy dielectric layer 60 (see below, FIGS. 18A-18B).

Figure 10A:
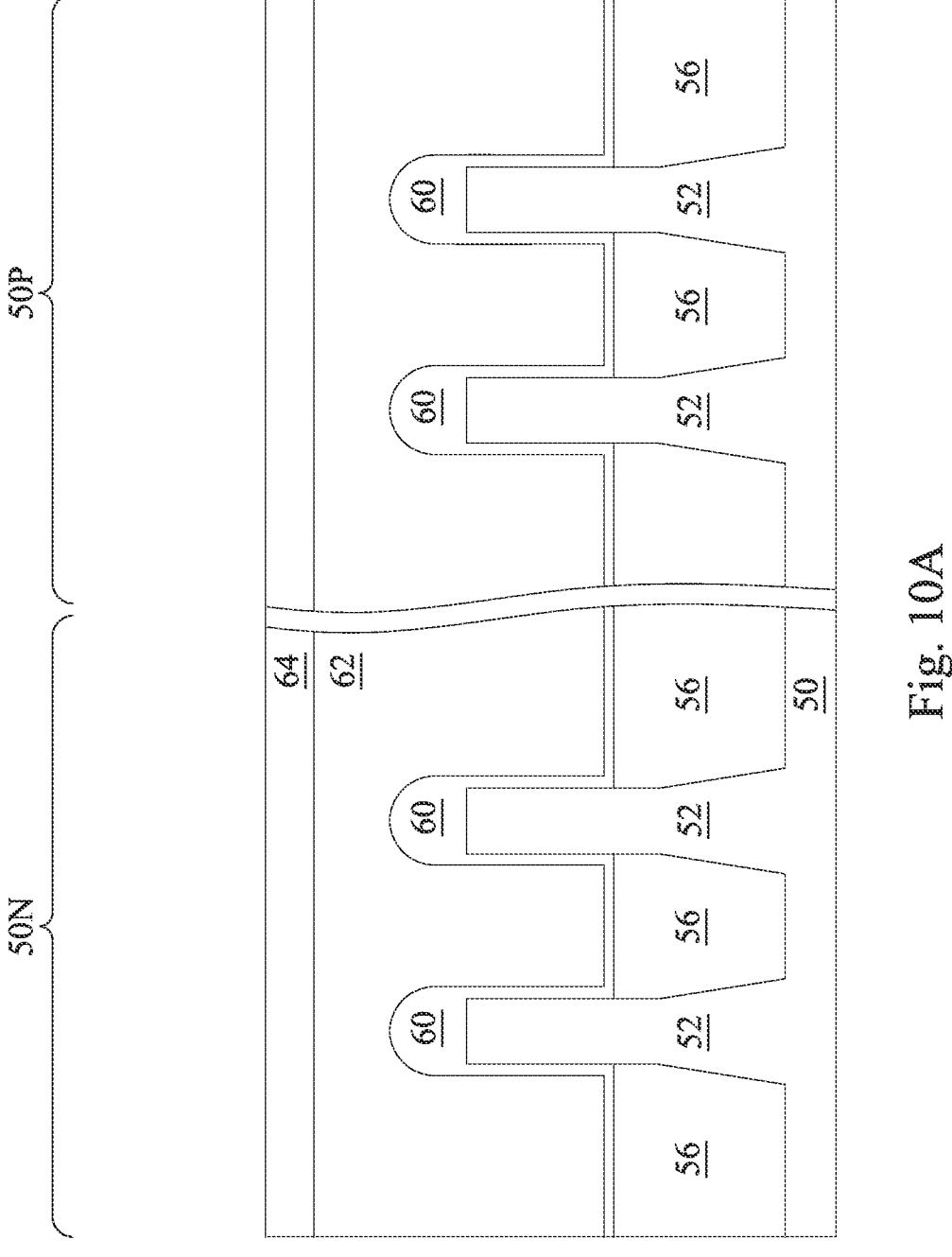
Figure 10B:
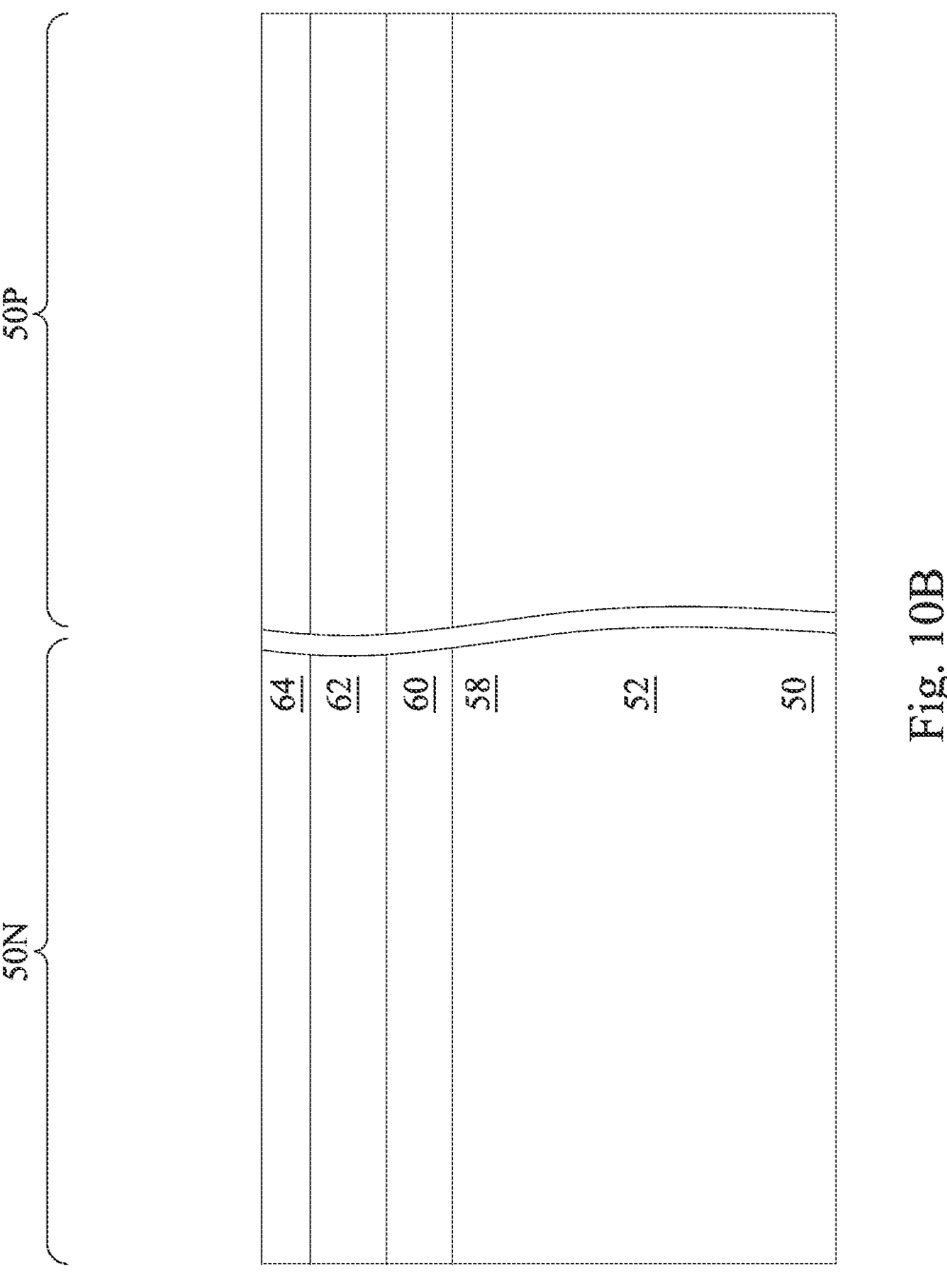

In FIGS. 10A and 10B, a dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive or semiconductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques for depositing the selected material. The dummy gate layer 62 may be made of other materials that have a high etching selectivity from the etching of isolation region, e.g., the STI regions 56 and/or the dummy dielectric layer 60. The mask layer 64 may include one or more layers of, for example, silicon nitride, silicon oxynitride, or the like. In this example, a single dummy gate layer 62 and a single mask layer 64 are formed across the n-type region 50N and the p-type region 50P.

FIGS. 11A through 21D illustrate various additional steps in the manufacturing of embodiment devices. FIGS. 11A through 21D illustrate features in either of the n-type region 50N and the p-type region 50P. For example, the structures illustrated in FIGS. 11A through 21D may be applicable to both the n-type region 50N and the p-type region 50P. Differences (if any) in the structures of the n-type region 50N and the p-type region 50P are described in the text accompanying each figure.

Figure 11B:
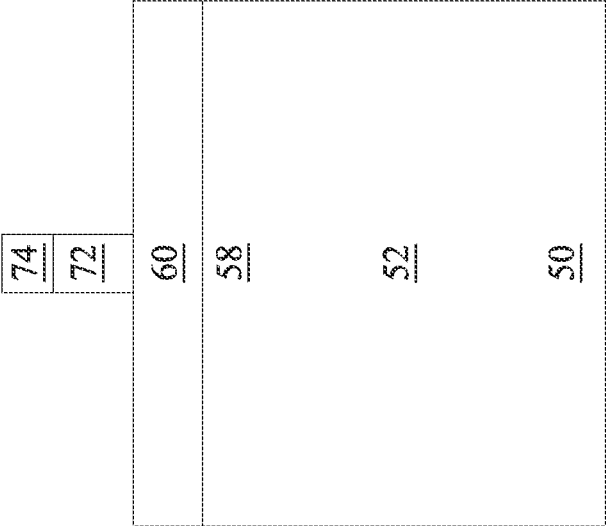
Figure 11A:
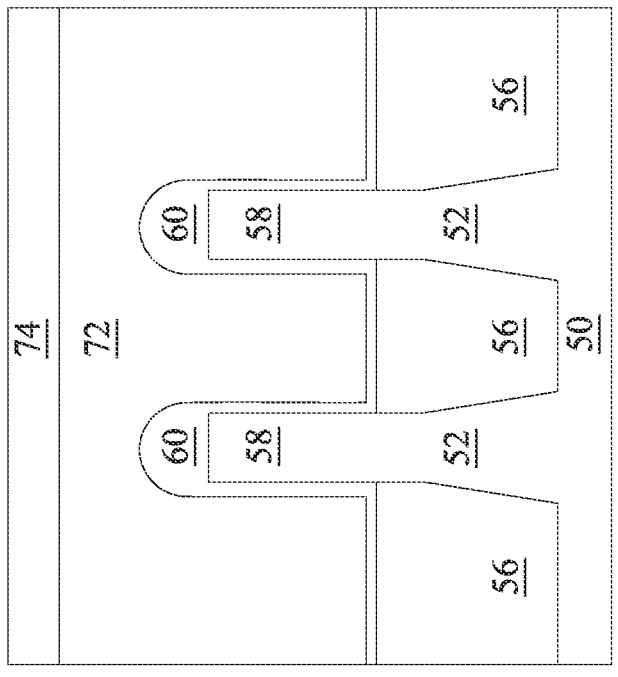

In FIGS. 11A and 11B, the mask layer 64 (see FIGS. 10A-10B) may be patterned using acceptable photolithography and etching techniques to form masks 74. The pattern of the masks 74 then may be transferred to the dummy gate layer 62 to form dummy gates 72. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective fins 52.

Figure 12B:
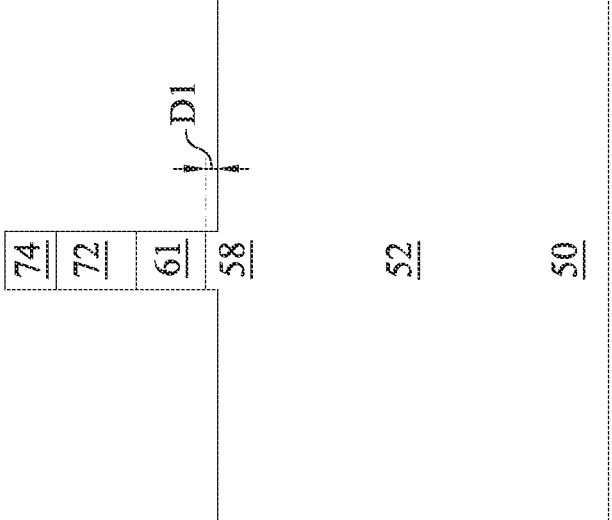
Figure 12A:
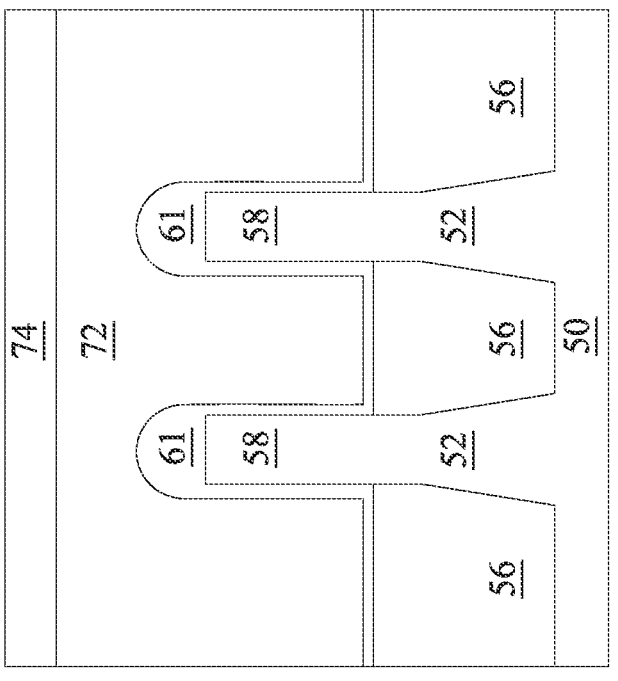

In FIGS. 12A and 12B, the pattern of the masks 74 and dummy gates 72 is transferred to the dummy dielectric layer 60 by an acceptable etching technique to form a dummy gate dielectric layer 61. In some embodiments, the dummy gate dielectric layer 61 is formed by an etch process comprising a wet etch process, a dry etch processes, or a combination thereof. In some embodiments, the etch process comprises a wet etch using dilute hydrofluoric acid, hydrochloric acid, the like, or a combination thereof as etchants. In some embodiments, the etch process comprises a dry etch using $NH_3$, HF, $O_2$, HBr, the like, or a combination thereof as etchants.

The top surfaces of the fins 52 may be etched by a distance D1 in a range of 1 nm to 2 nm due to the thickness T3 of the dummy dielectric layer 60 (see above, FIG. 9) covering the top surfaces of the fins 52. The fin loss of a distance D1 on the top surfaces of the fins 52 may be smaller than a respective fin loss occurring with a smaller thickness of the dummy dielectric layer 60 over the top surfaces of the fins 52. This may boost device performance by reducing contact resistance by about 3%=.

Figure 13B:
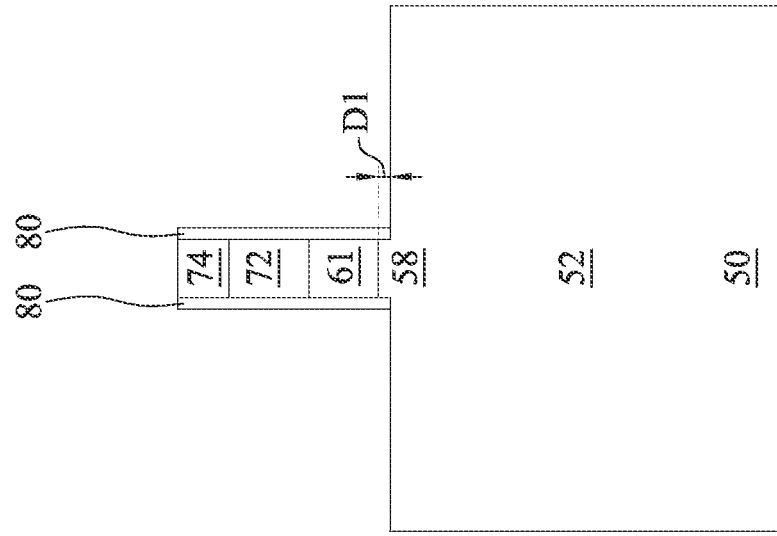
Figure 13A:
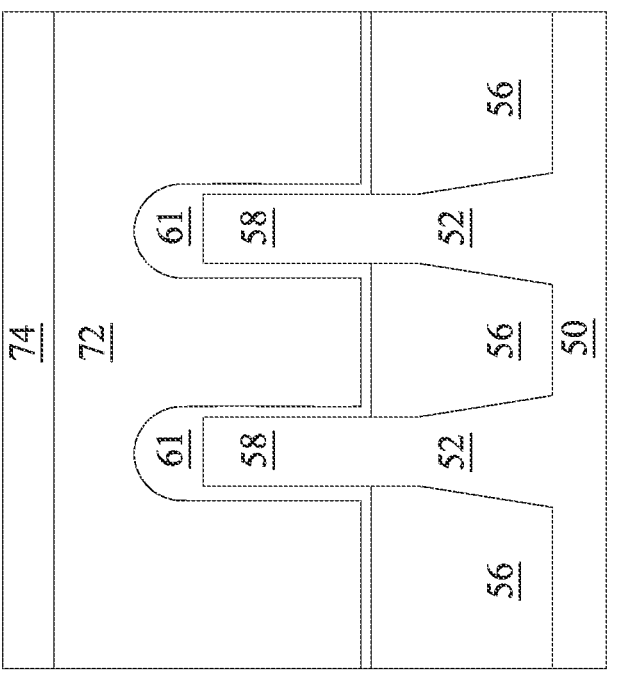

In FIGS. 13A and 13B, gate seal spacers 80 can be formed on exposed surfaces of the dummy gates 72, the masks 74, the dummy gate dielectric layer 61, and/or the fins 52. A thermal oxidation or a deposition followed by an anisotropic etch may form the gate seal spacers 80. In the illustrated embodiment, the gate seal spacers 80 are formed by a thermal oxidation of sidewall portions of the dummy gates 72, the masks 74, the dummy gate dielectric layer 61, and the fins 52. The gate seal spacers 80 may be formed of silicon oxide, silicon nitride, silicon oxynitride, or the like.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the n-type region 50N, while exposing the p-type region 50P, and appropriate type (e.g., p-type) impurities may be implanted into the exposed fins 52 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 52 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities.

Figure 14B:
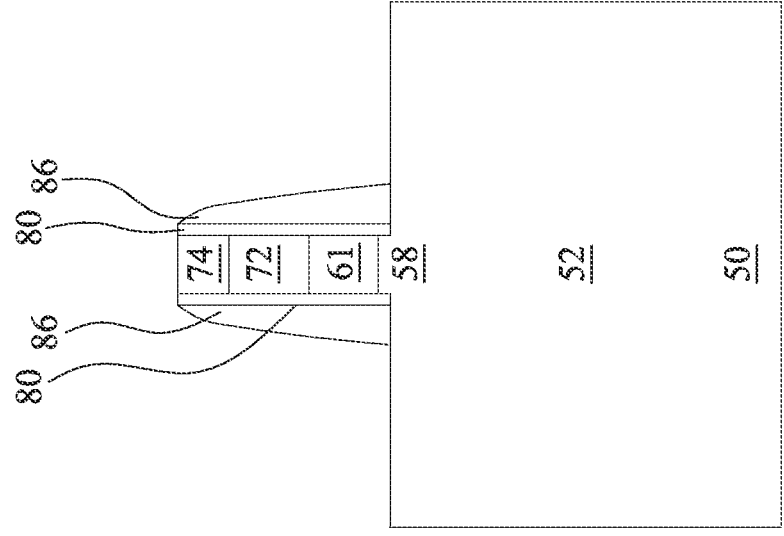
Figure 14A:
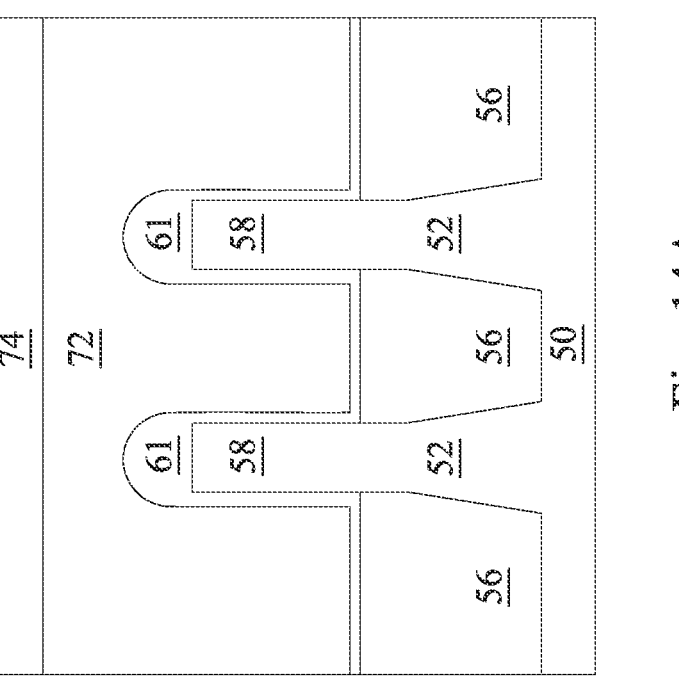

In FIGS. 14A and 14B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon oxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers, spacers may be formed and removed, and/or the like. Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

Figure 15B:
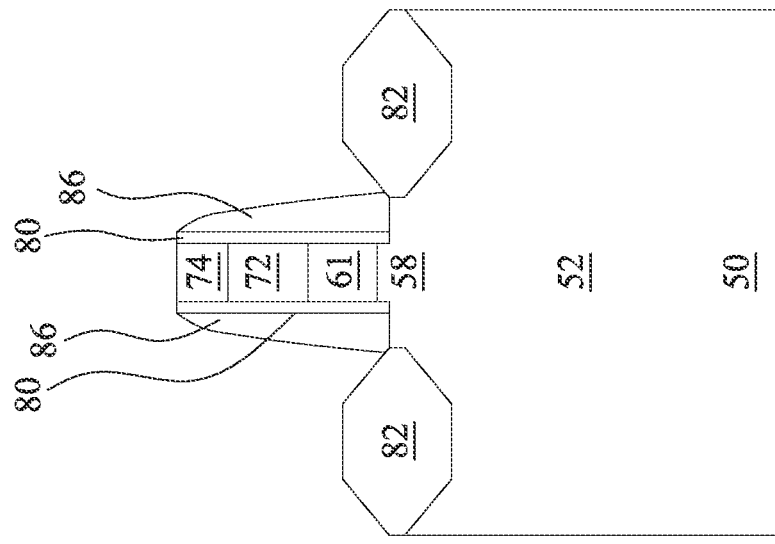
Figure 15A:
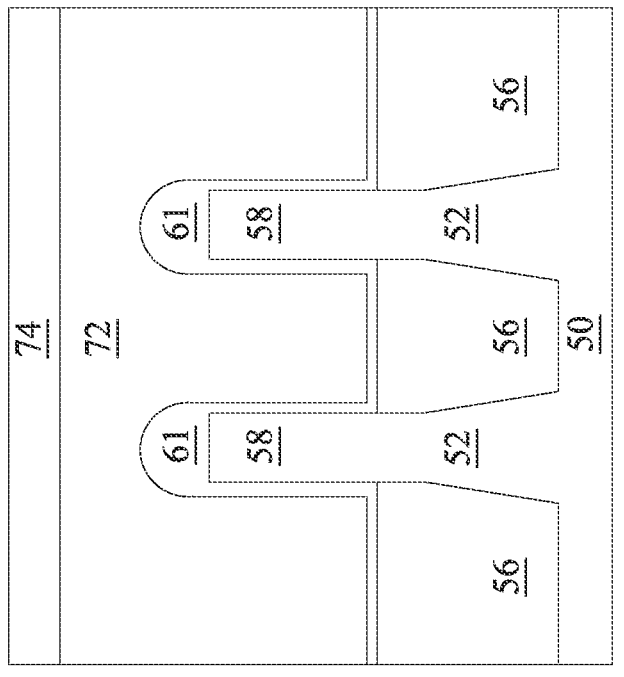
Figure 15D:
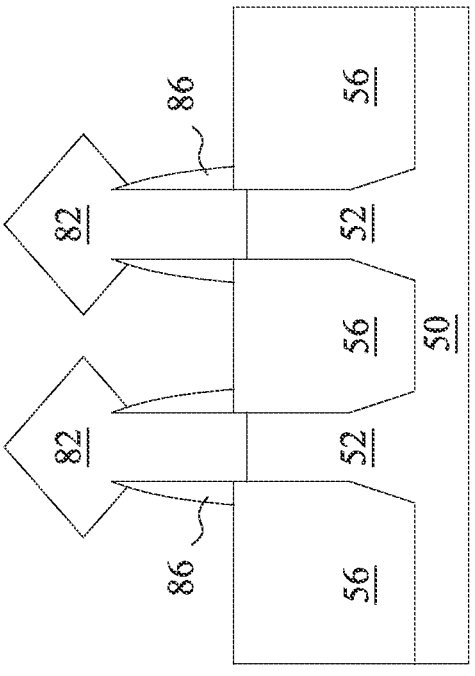
Figure 15C:
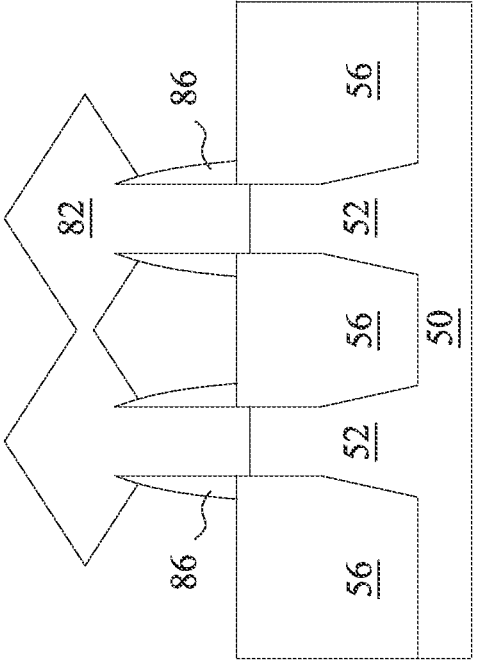

In FIGS. 15A and 15B epitaxial source/drain regions 82 are formed in the fins 52. The epitaxial source/drain regions 82 are formed in the fins 52 such that each dummy gate 72 is disposed between respective neighboring pairs of the epitaxial source/drain regions 82. In some embodiments the epitaxial source/drain regions 82 may extend into, and may also penetrate through, the fins 52. In some embodiments, the gate spacers 86 are used to separate the epitaxial source/drain regions 82 from the dummy gates 72 and the dummy gate dielectric layer 61 by an appropriate lateral distance so that the epitaxial source/drain regions 82 do not short out subsequently formed gates of the resulting FinFETs. A material of the epitaxial source/drain regions 82 may be selected to exert stress in the respective channel regions 58, thereby improving performance.

The epitaxial source/drain regions 82 in the n-type region 50N may be formed by masking the p-type region 50P and etching source/drain regions of the fins 52 in the n-type region 50N to form recesses in the fins 52. Then, the epitaxial source/drain regions 82 in the n-type region 50N are epitaxially grown in the recesses. The epitaxial source/drain regions 82 may include any acceptable material, such as appropriate for n-type FinFETs. For example, if the fin 52 is silicon, the epitaxial source/drain regions 82 in the n-type region 50N may include materials exerting a tensile strain in the channel region 58, such as silicon, silicon carbide, phosphorous doped silicon carbide, silicon phosphide, or the like. The epitaxial source/drain regions 82 in the n-type region 50N may have surfaces raised from respective surfaces of the fins 52 and may have facets.

The epitaxial source/drain regions 82 in the p-type region 50P may be formed by masking the n-type region 50N and etching source/drain regions of the fins 52 in the p-type region 50P to form recesses in the fins 52. Then, the epitaxial source/drain regions 82 in the p-type region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the p-type region 50P may comprise materials exerting a compressive strain in the channel region 58, such as silicon-germanium, boron doped silicon-germanium, germanium, germanium tin, or the like. The epitaxial source/drain regions 82 in the p-type region 50P may have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the n-type region 50N and the p-type region 50P, upper surfaces of the epitaxial source/drain regions have facets which expand laterally outward beyond sidewalls of the fins 52. In some embodiments, these facets cause adjacent source/drain regions 82 of a same FinFET to merge as illustrated by FIG. 15C. In other embodiments, adjacent source/drain regions 82 remain separated after the epitaxy process is completed as illustrated by FIG. 15D. In the embodiments illustrated in FIGS. 15C and 15D, gate spacers 86 are formed covering a portion of the sidewalls of the fins 52 that extend above the STI regions 56 thereby blocking the epitaxial growth. In some other embodiments, the spacer etch used to form the gate spacers 86 may be adjusted to remove the spacer material to allow the epitaxially grown region to extend to the surface of the STI region 56.

Figure 16B:
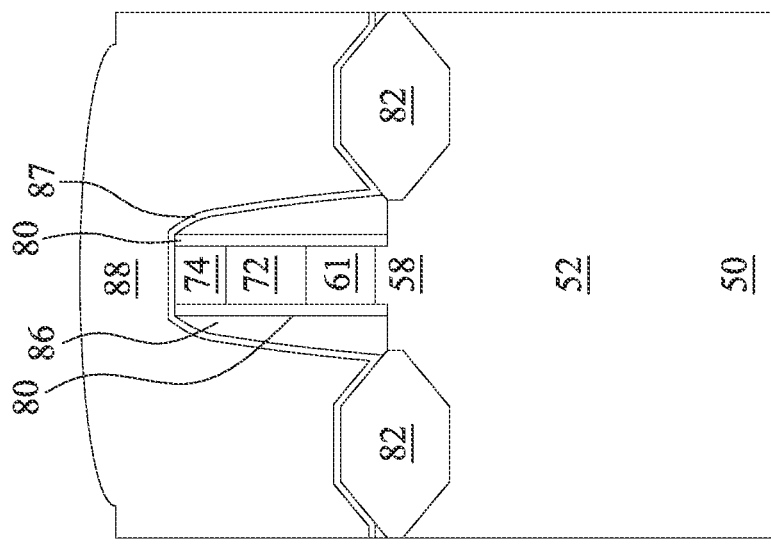
Figure 16A:
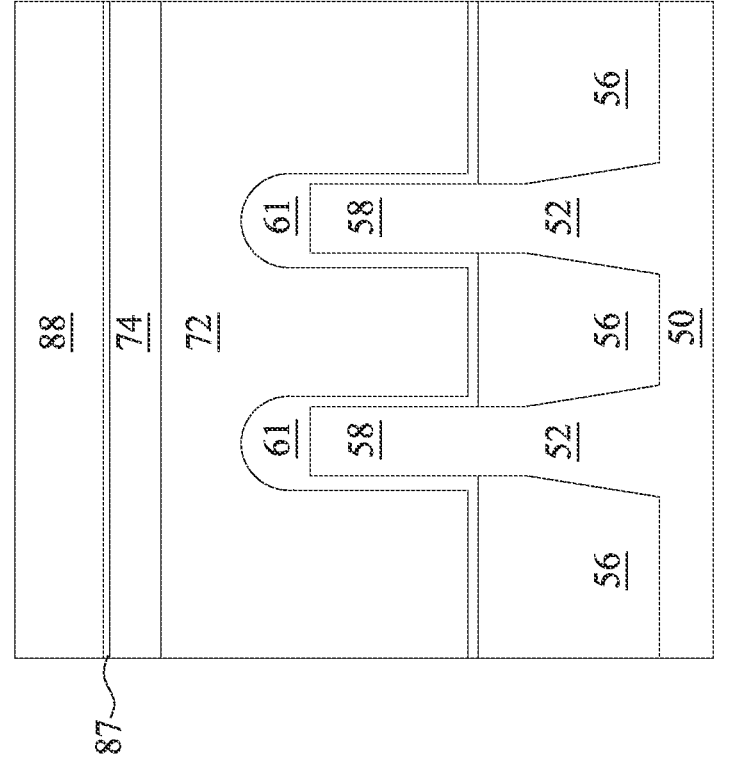

In FIGS. 16A and 16B, a first interlayer dielectric (ILD) 88 is deposited over the structure illustrated in FIGS. 15A and 15B. The first ILD 88 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 87 is disposed between the first ILD 88 and the epitaxial source/drain regions 82, the masks 74, and the gate spacers 86. The CESL 87 may comprise a dielectric material, such as, silicon nitride, silicon oxide, silicon oxynitride, or the like, having a lower etch rate than the material of the overlying first ILD 88.

Figure 17B:
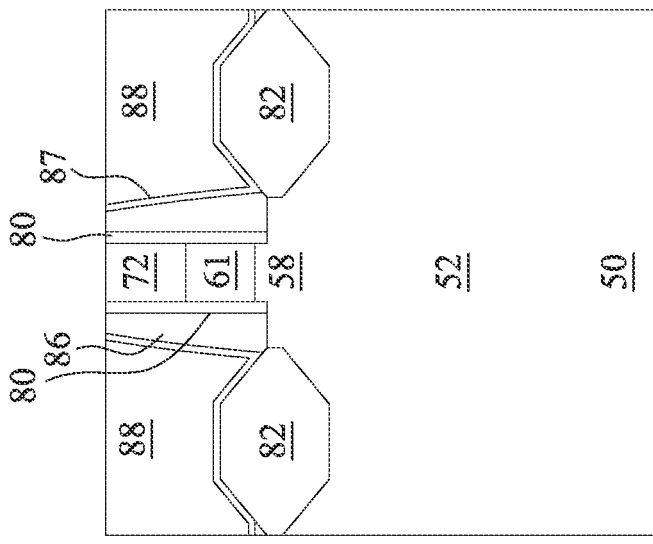
Figure 17A:
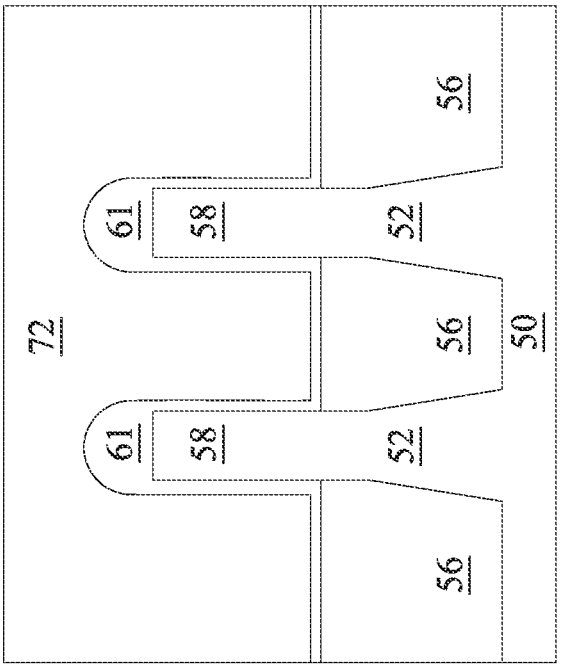

In FIGS. 17A and 17B, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surfaces of the top surface of the masks 74.

FIGS. 18A through 21D illustrate various additional steps in the manufacturing of embodiment devices in a first region 500 of a die (e.g., a core logic region) and in a second region 600 of a die (e.g., an input/output region). FIGS. 18A, 18B, 19A, 19B, 19C, 20A, 20B, 21A, and 21B illustrate the first region 500, and FIGS. 18C, 18D, 19D, 19E, 19F, 20C, 20D, 21C, and 21D illustrate the second region 600.

Figure 18B:
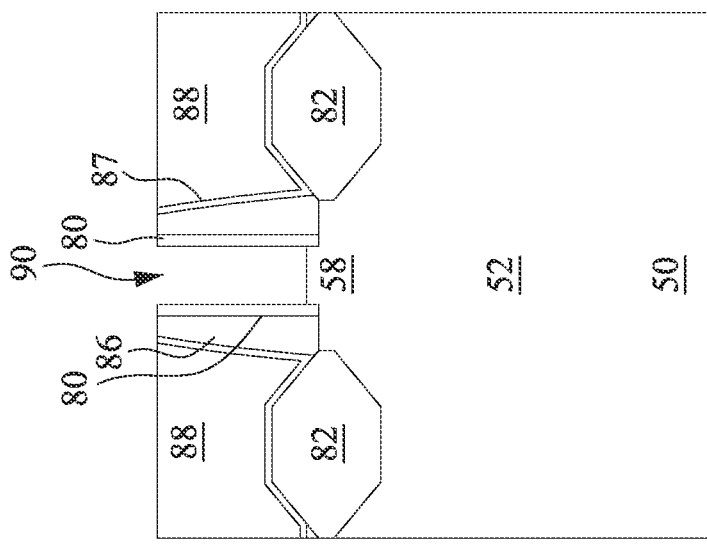
Figure 18A:
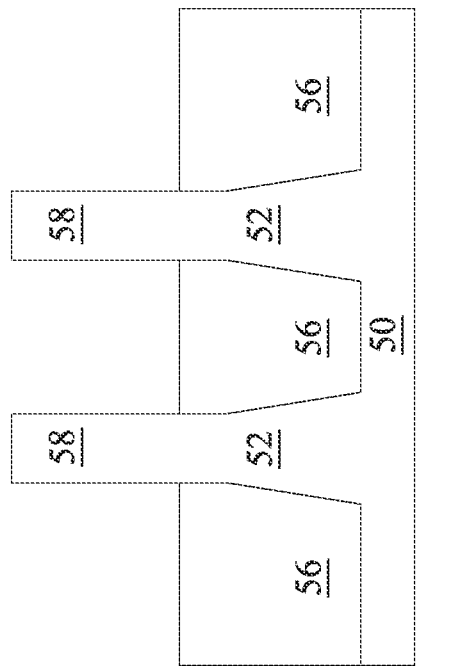
Figure 18D:
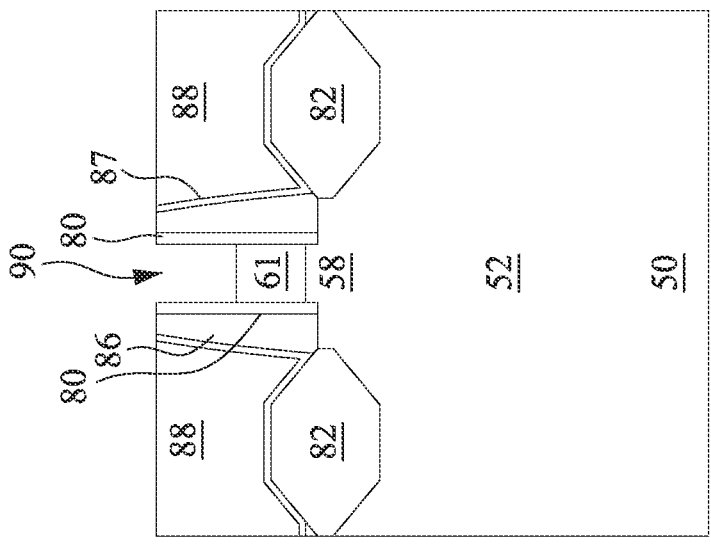
Figure 18C:
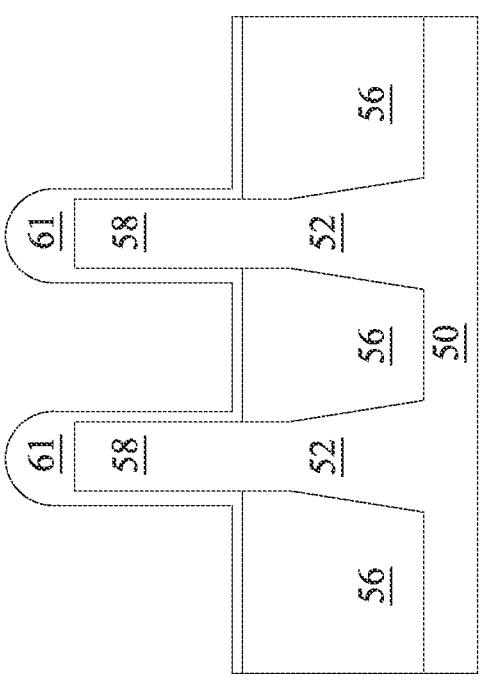

In FIGS. 18A through 18D, the dummy gates 72, and the masks 74 if present, are removed in an etching step(s), so that recesses 90 are formed. Portions of the dummy dielectric layer 60 in the recesses 90 may also be removed. In some embodiments, only the dummy gates 72 are removed and the dummy gate dielectric layer 61 remains and is exposed by the recesses 90. In some embodiments, the dummy gate dielectric layer 61 is removed from recesses 90 in a first region 500 of a die (e.g., a core logic region) and remains in recesses 90 in a second region 600 of the die (e.g., an input/output region). In some embodiments, the dummy gates 72 are removed by an anisotropic dry etch process. For example, the etching process may include a dry etch process using reaction gas(es) that selectively etch the dummy gates 72 with little or no etching of the first ILD 88 or the gate spacers 86. Each recess 90 exposes and/or overlies a channel region 58 of a respective fin 52. Each channel region 58 is disposed between neighboring pairs of the epitaxial source/drain regions 82. During the removal, the dummy gate dielectric layer 61 may be used as an etch stop layer when the dummy gates 72 are etched. The dummy gate dielectric layer 61 may then be removed in the first region 500 after the removal of the dummy gates 72 as illustrated in FIGS. 18A-B and may remain in the second region 600 as illustrated in FIGS. 18C-D. Various masking steps may be used to mask and expose appropriate regions when using distinct processes.

Figure 19B:
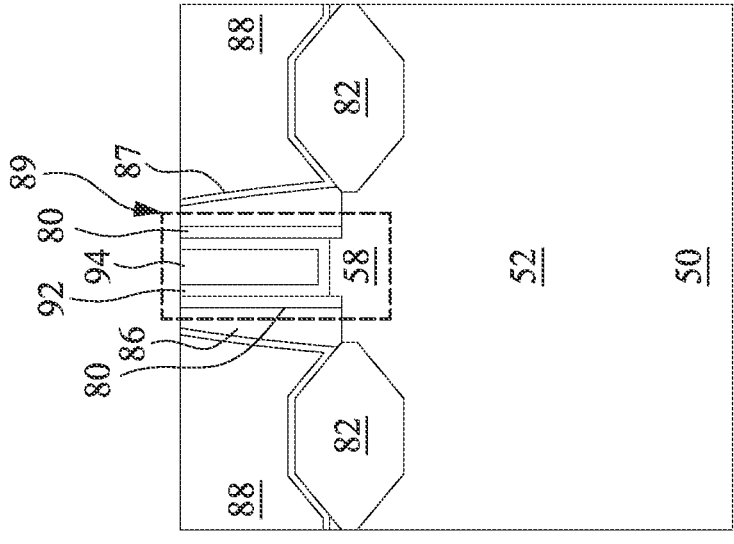
Figure 19A:
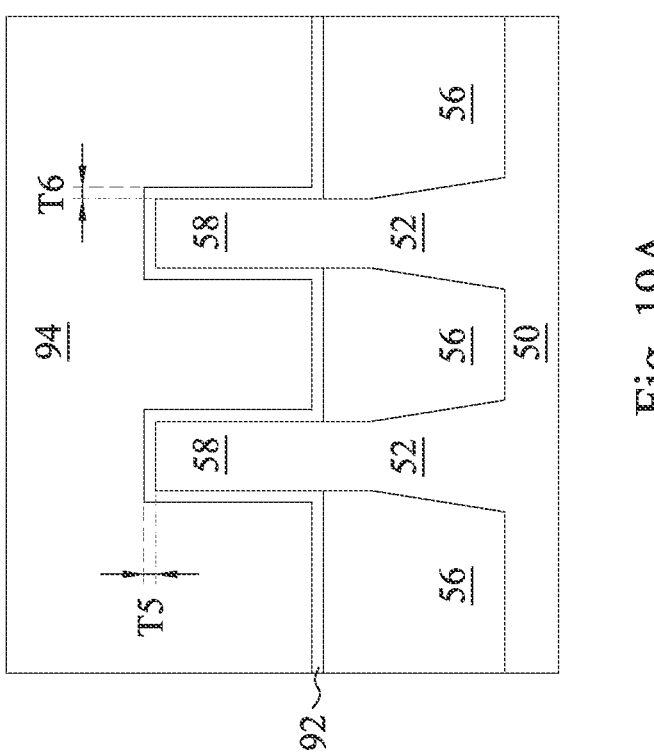
Figure 19C:
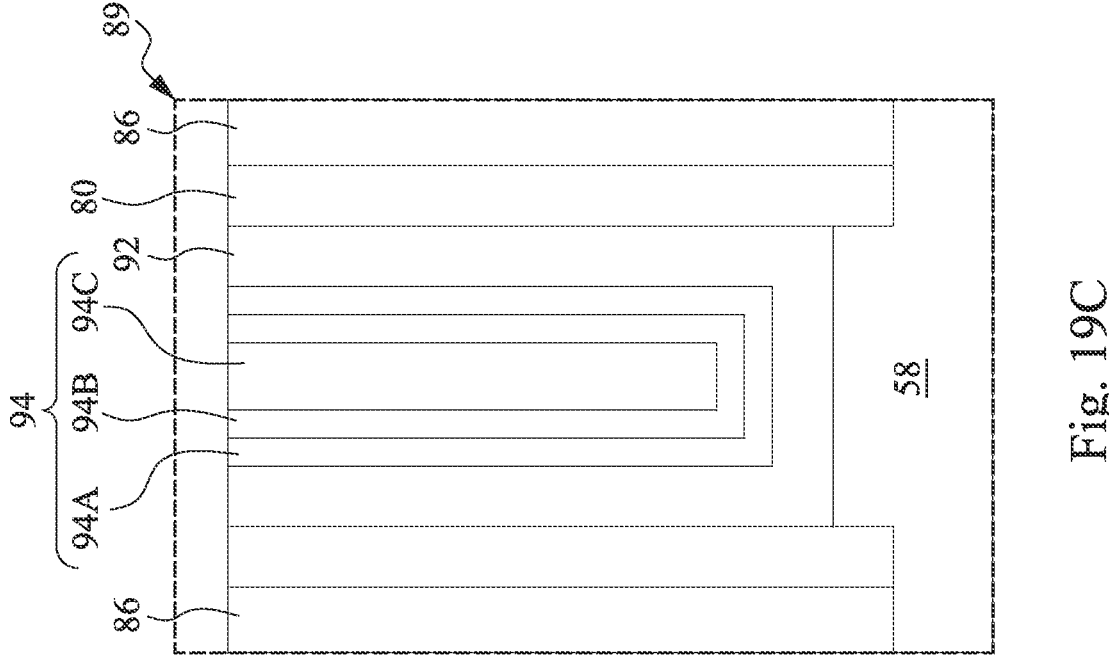
Figure 19E:
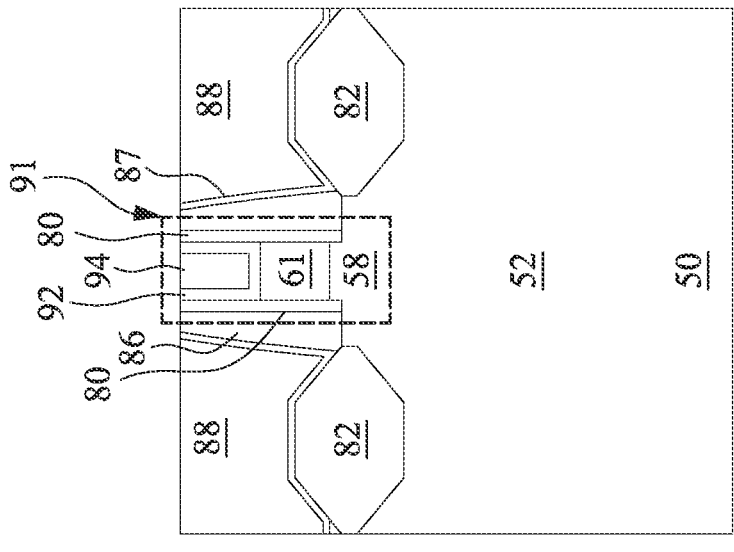
Figure 19D:
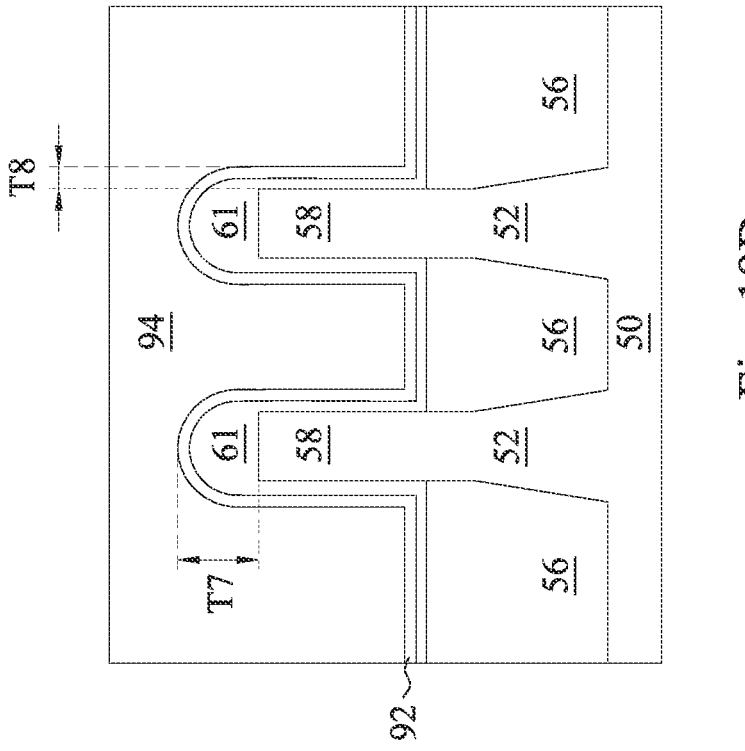
Figure 19F:
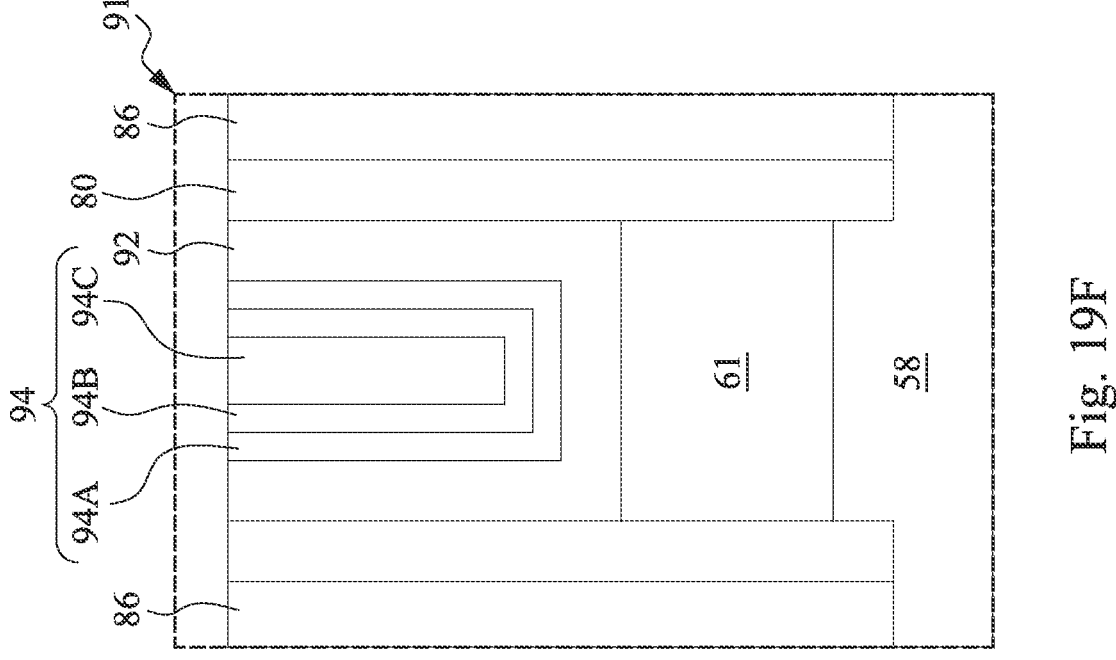
Figure 20B:
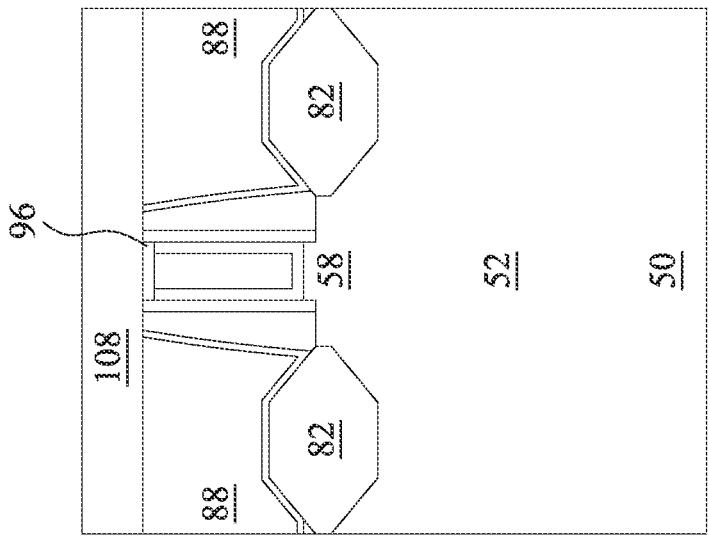
Figure 20A:
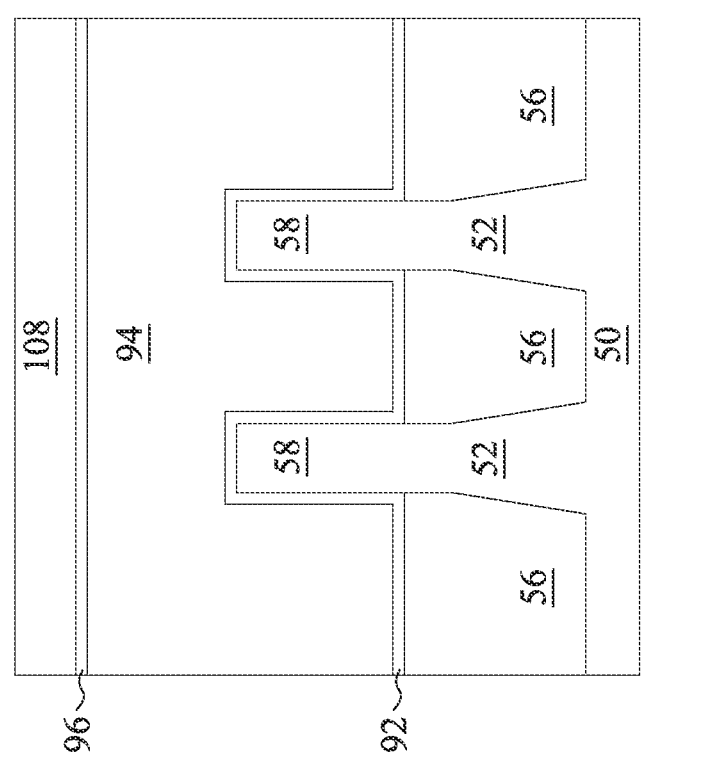
Figure 20D:
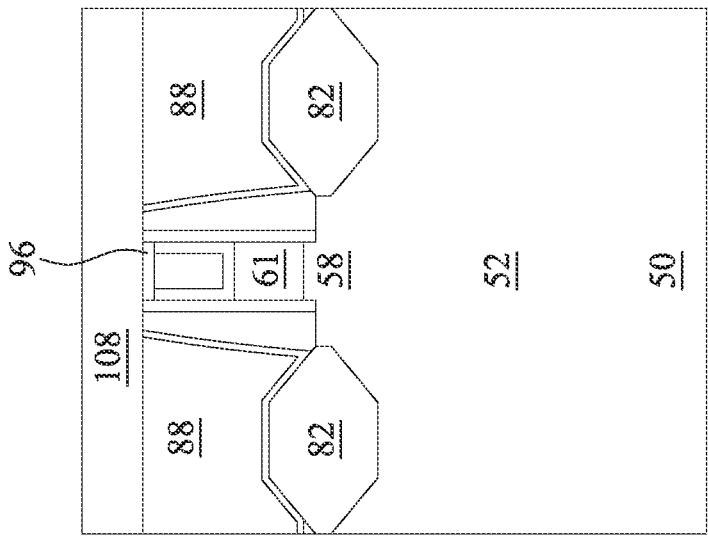
Figure 20C:
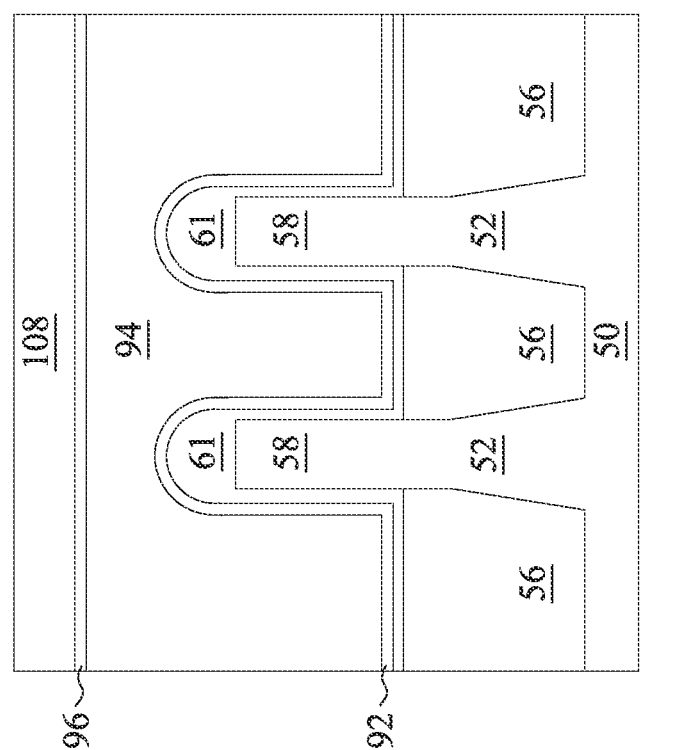
Figure 21B:
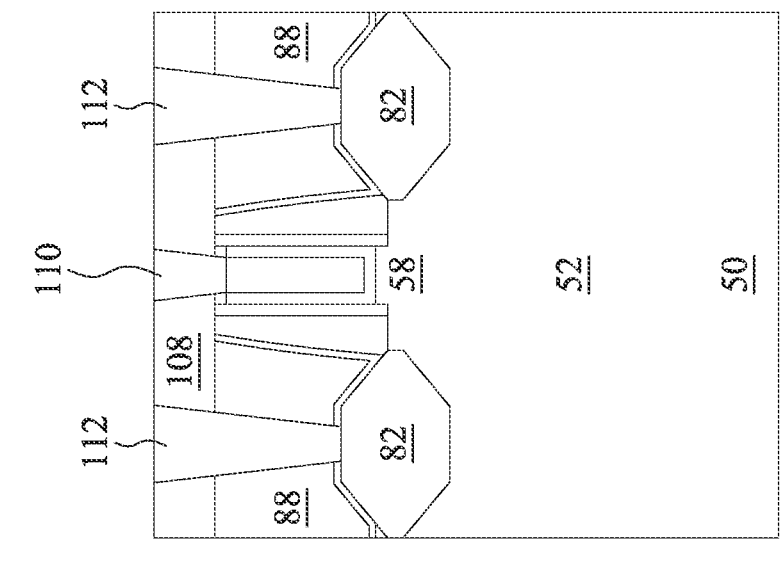
Figure 21A:
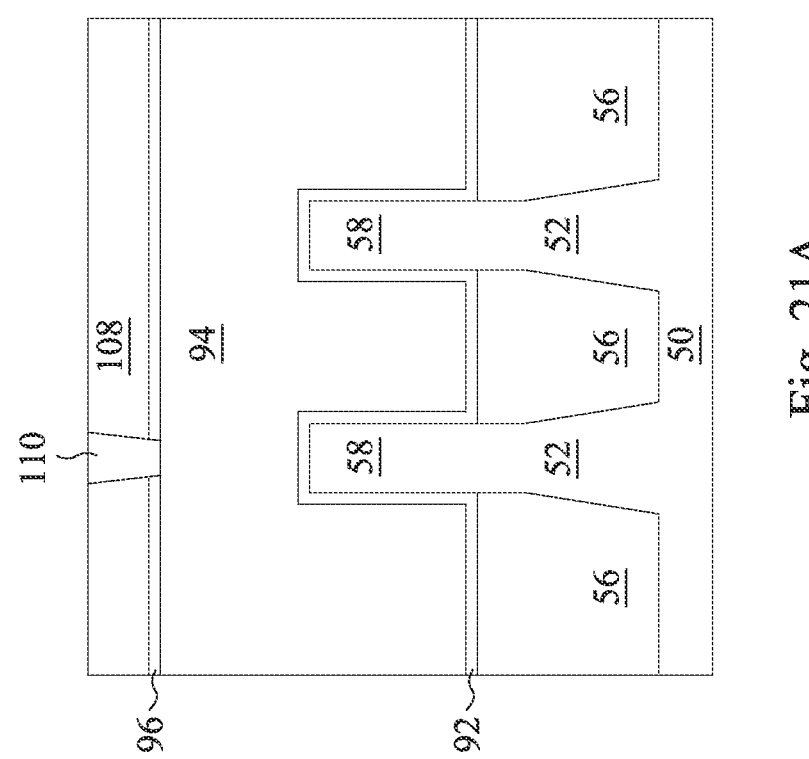
Figure 21D:
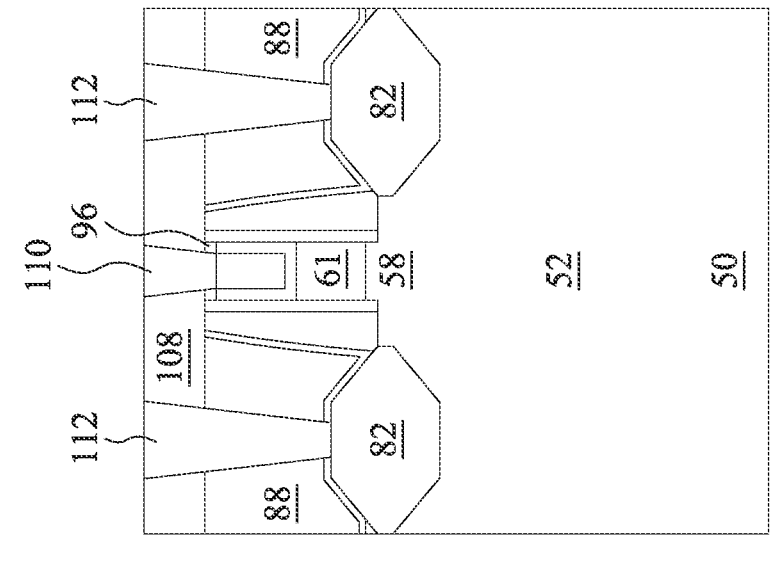
Figure 21C:
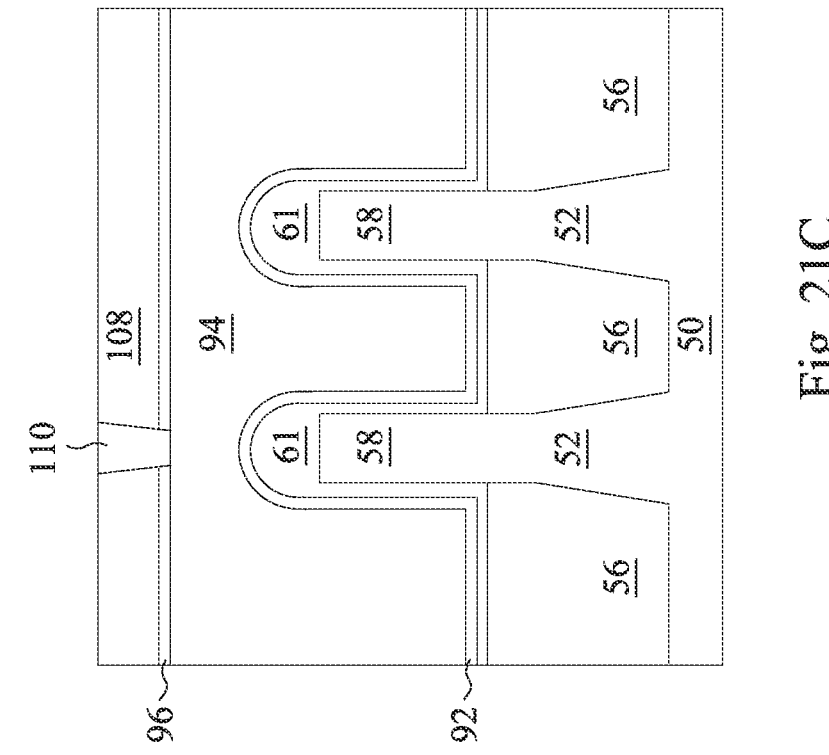

In FIGS. 19A, 19B, 19D, and 19E, gate dielectric layers 92 and gate electrodes 94 are formed for replacement gates. FIG. 19C illustrates a detailed view of region 89 of FIG. 19B, and FIG. 19F illustrates a detailed view of region 91 of FIG. 19E. Gate dielectric layers 92, comprising one or more layers, are deposited in the recesses 90. In some embodiments, in the first region 500 the gate dielectric layers 92 are deposited on the top surfaces and the sidewalls of the fins 52 and on sidewalls of the gate seal spacers 80/gate spacers 86 as illustrated in FIGS. 19A-B, and in the second region 600 the gate dielectric layers 92 are deposited on the top surfaces and the sidewalls of the dummy gate dielectric layer 61 and on sidewalls of the gate seal spacers 80/gate spacers 86 as illustrated in FIGS. 19D-E. The gate dielectric layers 92 may also be formed on the top surface of the first ILD 88. In some embodiments, the gate dielectric layers 92 comprise one or more dielectric layers, such as one or more layers of silicon oxide, silicon nitride, metal oxide, metal silicate, or the like. For example, in some embodiments, the gate dielectric layers 92 in the first region 500 include an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, and combinations thereof, as illustrated in FIGS. 19A-B, and the gate dielectric layers 92 in the second region 600 include a high-k dielectric material as illustrated in FIGS. 19D-E. The gate dielectric layers 92 may include a dielectric layer having a k value greater than about 7.0. The formation methods of the gate dielectric layers 92 may include Molecular-Beam Deposition (MBD), ALD, PECVD, and the like.

In some embodiments, the gate dielectric layers 92 in the first region 500 have a fifth thickness T5 measured between a top surface of the fins 52 and a top surface of the gate dielectric layers 92 over the fins 52 in a range of 5 Å to 20 Å and a sixth thickness T6 measured between a sidewall of the fins 52 and an outer sidewall of the gate dielectric layers 92 in a range of 5 Å to 20 Å, as illustrated by FIG. 19A. In some embodiments, the gate dielectric layers 92 in the second region 600 have the same fifth thickness T5 and sixth thickness T6 as the gate dielectric layers 92 in the first region 500. In some embodiments, the dummy gate dielectric layer 61 and the gate dielectric layers 92 in the second region 600 have a combined seventh thickness T7 measured between a top surface of the fins 52 and a top surface of the gate dielectric layers 92 over the fins 52 in a range of 40 Å to 80 Å and a combined eighth thickness T8 measured between a sidewall of the fins 52 and an outer sidewall of the gate dielectric layers 92 in a range of 20 Å to 60 Å, as illustrated by FIG. 19D.

The gate electrodes 94 are deposited over the gate dielectric layers 92, respectively, and fill the remaining portions of the recesses 90. The gate electrodes 94 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 94 is illustrated in FIGS. 19B and 19E, the gate electrode 94 may comprise any number of liner layers 94A, any number of work function tuning layers 94B, and a fill material 94C as illustrated by FIGS. 19C and 19F. After the filling of the recesses 90, a planarization process, such as a CMP, may be performed to remove the excess portions of the gate dielectric layers 92 and the material of the gate electrodes 94, which excess portions are over the top surface of the ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack." The gate and the gate stacks may extend along sidewalls of a channel region 58 of the fins 52.

The formation of the gate dielectric layers 92 in the n-type region 50N and the p-type region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

In FIGS. 20A through 20D, a gate mask 96 is formed over the gate stack (including a gate dielectric layer 92 and a corresponding gate electrode 94), and the gate mask may be disposed between opposing portions of the gate spacers 86. In some embodiments, forming the gate mask 96 includes recessing the gate stack so that a recess is formed directly over the gate stack and between opposing portions of gate spacers 86. A gate mask 96 comprising one or more layers of dielectric material, such as silicon nitride, silicon oxynitride, or the like, is filled in the recess, followed by a planarization process to remove excess portions of the dielectric material extending over the first ILD 88. The gate mask 96 is optional and may be omitted in some embodiments. In such embodiments, the gate stack may remain level with top surfaces of the first ILD 88.

As also illustrated in FIGS. 20A through 20D, a second ILD 108 is deposited over the first ILD 88. In some embodiments, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD. The subsequently formed gate contacts 110 (see below, FIGS. 21A through 21D) penetrate through the second ILD 108 and the gate mask 96 (if present) to contact the top surface of the recessed gate electrode 94.

In FIGS. 21A through 21D, gate contacts 110 and source/drain contacts 112 are formed through the second ILD 108 and the first ILD 88 in accordance with some embodiments. Openings for the source/drain contacts 112 are formed through the first and second ILDs 88 and 108, and openings for the gate contact 110 are formed through the second ILD 108 and the gate mask 96 (if present). The openings may be formed using acceptable photolithography and etching techniques. A liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the ILD 108. The remaining liner and conductive material form the source/drain contacts 112 and gate contacts 110 in the openings. An anneal process may be performed to form a silicide at the interface between the epitaxial source/drain regions 82 and the source/drain contacts 112. The source/drain contacts 112 are physically and electrically coupled to the epitaxial source/drain regions 82, and the gate contacts 110 are physically and electrically coupled to the gate electrodes 106. The source/drain contacts 112 and gate contacts 110 may be formed in different processes, or may be formed in the same process. Although shown as being formed in the same cross-sections, it should be appreciated that each of the source/drain contacts 112 and gate contacts 110 may be formed in different cross-sections, which may avoid shorting of the contacts.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Patent Application Publication No. 2016/0365414, which is incorporated herein by reference in its entirety.

Embodiments may achieve advantages. Prior to forming dummy gates over semiconductor fins, a dielectric layer is formed having a greater thickness over top surfaces of the semiconductor fins than on sidewalls of the semiconductor fins. The greater thickness of the dielectric layers over the top surfaces of the fins may boost device performance by reducing fin loss during subsequent patterning processes of the dummy gates. Because the process to form the dielectric layer can be integrated with a standard process flow, the process to form the dielectric layers is low cost may achieve high rates of wafers per hour (WPH).

In accordance with an embodiment, a method of forming a semiconductor device includes: forming a first layer over a semiconductor fin, the first layer being a first material; forming a second layer over the first layer, the second layer being thicker on a top of the semiconductor fin than along a sidewall of the semiconductor fin, the second layer being a second material; performing an oxidation process, the oxidation process oxidizing at least a portion of the second layer; forming a dummy gate layer over the second layer; and patterning the dummy gate layer, the second layer, and the first layer, wherein patterning the dummy gate layer, the second layer, and the first layer exposes a top surface of the semiconductor fin. In an embodiment, the first material includes silicon oxide. In an embodiment, the second layer is formed with physical vapor deposition using a target, the target including silicon. In an embodiment, the second material is silicon. In an embodiment, the oxidation process converts the second material to silicon oxide. In an embodiment, the first layer has a thickness in a range of 15 Å to 40 Å. In an embodiment, the second layer has a thickness measured on top surfaces of the first layer over the semiconductor fin in a range of 5 Å to 25 Å. In an embodiment, the first layer and the second layer have a first combined thickness measured between a top surface of the semiconductor fin and a top surface of the second layer, the first and the second layer have a second combined thickness measured on a sidewall of the semiconductor fin, and a ratio of the first combined thickness to the second combined thickness is in a range of 2:1 to 5:1.

In accordance with another embodiment, a method of forming a semiconductor device includes: forming a dummy dielectric layer over a first fin and a second fin, wherein the first fin is in a first region of a die and the second fin is in a second region of the die, wherein forming the dummy dielectric layer includes: forming a first layer over the first fin and the second fin; depositing a second layer over the first layer, wherein the second layer covers a first top surface of the first layer over the first fin and the second layer covers a second top surface of the first layer over the second fin, a thickness of the second layer tapering along sidewalls of the first layer; and oxidizing the second layer; removing a first portion of the dummy dielectric layer over the first fin, wherein a second portion of the dummy dielectric layer remains on the second fin; and forming a first gate electrode over the first fin and forming a second gate electrode over the second portion of the dummy dielectric layer, wherein a region between the first gate electrode and the first fin is free of the dummy dielectric layer. In an embodiment, the first layer is silicon dioxide. In an embodiment, before oxidizing the second layer, the second layer is silicon carbide, silicon nitride, or silicon carbonitride. In an embodiment, after oxidizing the second layer, the second layer is silicon dioxide. In an embodiment, the dummy dielectric layer has a first thickness measured between a top surface of the first fin and a top surface of the second layer in a range of 40 Å to 80 Å. In an embodiment, the dummy dielectric layer has a second thickness measured on a sidewall of the first fin in a range of 20 Å to 60 Å. In an embodiment, a ratio of the first thickness to the second thickness is in a range of 2:1 to 5:1. In an embodiment, the method further includes forming a gate dielectric layer over the first fin and over the second portion of the dummy dielectric layer. In an embodiment, the gate dielectric layer has a third thickness measured between a top surface of the first fin and a top surface of the gate dielectric layer and, wherein the gate dielectric layer and the second portion of the dummy dielectric layer have a fourth thickness measured between a top surface of the second fin and the top surface of the gate dielectric layer, and wherein the fourth thickness is greater than the third thickness.

In accordance with yet another embodiment, a semiconductor device includes: a first semiconductor fin in a first region of a die; a second semiconductor fin in a second region of the die; a first gate dielectric on the first semiconductor fin, the first gate dielectric covering a top surface of the first semiconductor fin; a first dielectric layer on the second semiconductor fin, the first dielectric layer being thicker on a top of the second semiconductor fin than along a sidewall of the second semiconductor fin; a second gate dielectric on the first dielectric layer; a first gate electrode on the first gate dielectric; and a second gate electrode on the second gate dielectric, wherein the first gate electrode is free of an underlying portion of the first dielectric layer. In an embodiment, the first dielectric layer has a first thickness measured between a top surface of the second semiconductor fin and a top surface of the first dielectric layer, the first dielectric layer has a second thickness measured on a sidewall of the second semiconductor fin, and a ratio of the first thickness to the second thickness is in a range of 2:1 to 5:1. In an embodiment, the first gate dielectric and the second gate dielectric have a same thickness.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:

forming a first layer over a semiconductor fin, the first layer being a first material;

forming a second layer over the first layer, the second layer being thicker on a first portion of the first layer that is on a top surface of the semiconductor fin than a second portion of the first layer that is along a sidewall of the semiconductor fin, the second layer being a second material;

performing an oxidation process applied to an exposed top surface of the second layer that is on the first portion of the first layer, and exposed sidewall surfaces of the second layer that are on the second portion of the first layer, the oxidation process fully oxidizing the second layer, wherein before the oxidation process, the second material of the second layer comprises carbon or nitrogen, and wherein the oxidation process removes carbon or nitrogen atoms from the second material of the second layer;

forming a dummy gate layer over the second layer; and patterning the dummy gate layer, the second layer, and the first layer, wherein patterning the dummy gate layer, the second layer, and the first layer exposes the top surface of the semiconductor fin.

2. The method of claim 1, wherein the first material comprises silicon oxide.

3. The method of claim 1, wherein the second layer is formed with physical vapor deposition using a target, the target comprising silicon.

4. The method of claim 1, wherein the oxidation process converts the second material to silicon oxide.

5. The method of claim 1, wherein the first layer has a thickness in a range of 15 Å to 40 Å.

6. The method of claim 1, wherein the second layer has a thickness measured on top surfaces of the first layer over the semiconductor fin in a range of 5 Å to 25 Å.

7. The method of claim 1, wherein the first layer and the second layer have a first combined thickness measured between the top surface of the semiconductor fin and the exposed top surface of the second layer, the first and the second layer have a second combined thickness measured on the sidewall of the semiconductor fin, and a ratio of the first combined thickness to the second combined thickness is in a range of 2:1 to 5:1.

8. A method of forming a semiconductor device, the method comprising:

forming a dummy dielectric layer over a first fin and a second fin, wherein the first fin is in a first region of a die and the second fin is in a second region of the die, wherein forming the dummy dielectric layer comprises:

forming a first layer over the first fin and the second fin;

depositing a second layer over the first layer, wherein the second layer covers a first top surface of the first layer over the first fin and the second layer covers a second top surface of the first layer over the second fin, a thickness of the second layer tapering along sidewalls of the first layer that are on first sidewalls of the first fin and second sidewalls of the second fin; and applying an oxidation process to first exposed surfaces of the second layer that are over the first top surface and the second top surface of the first layer, and second exposed surfaces of the second layer that are on the sidewalls of the first layer, wherein before oxidizing the second layer, the second layer is silicon carbide, silicon nitride, or silicon carbonitride, and wherein the oxidizing process oxidizes the second layer and removes carbon or nitrogen atoms from the second layer;

removing a first portion of the dummy dielectric layer over the first fin, wherein a second portion of the dummy dielectric layer remains on the second fin; and forming a first gate electrode over the first fin and forming a second gate electrode over the second portion of the dummy dielectric layer, wherein a region between the first gate electrode and the first fin is free of the dummy dielectric layer.

9. The method of claim 8, wherein the first layer is silicon dioxide.

10. The method of claim 8, wherein after oxidizing the second layer, the second layer is silicon dioxide.

11. The method of claim 8, wherein the dummy dielectric layer has a first thickness measured between the first top surface of the first fin and a top surface of the second layer in a range of 40 Å to 80 Å.

12. The method of claim 11, wherein the dummy dielectric layer has a second thickness measured on the sidewalls of the first fin in a range of 20 Å to 60 Å.

13. The method of claim 12, wherein a ratio of the first thickness to the second thickness is in a range of 2:1 to 5:1.

14. The method of claim 8, further comprising forming a gate dielectric layer over the first fin and over the second portion of the dummy dielectric layer.

15. The method of claim 14, wherein the gate dielectric layer has a third thickness measured between a top surface of the first fin and a top surface of the gate dielectric layer and, wherein the gate dielectric layer and the second portion of the dummy dielectric layer have a fourth thickness measured between a top surface of the second fin and the top surface of the gate dielectric layer, and wherein the fourth thickness is greater than the third thickness.

16. A method of forming a semiconductor device, the method comprising:

forming a first layer over a semiconductor fin, the first layer being a first material;

forming a second layer of a second material over the first layer, the second layer being formed by a physical vapor deposition process, wherein the second layer is thicker on a first portion of the first layer that is on a top surface of the semiconductor fin than a second portion of the first layer that is along a sidewall of the semiconductor fin;

converting at least a portion of the second material of the second layer to an oxide with an oxidation process, the oxidation process being directly applied to a first top surface of the second layer that is on the first portion of the first layer, and a second sidewall surface of the second layer that is on the second portion of the first layer, wherein in a cross-sectional view, an entirety of the first top surface and an entirety of the second sidewall surface is exposed during the oxidation process, wherein the second material of the second layer is a dielectric material comprising carbon or nitrogen prior to the oxidation process, and wherein the oxidation process fully coverts the second material of the second layer to the oxide;

forming a dummy gate layer over the second layer; and patterning the dummy gate layer, the second layer, and the first layer, wherein patterning the dummy gate layer, the second layer, and the first layer exposes the top surface of the semiconductor fin.

17. The method of claim 16, wherein the oxidation process comprises $O_2$ gas, ozone, oxygen plasma or a combination thereof.

18. The method of claim 16, wherein the oxidation process comprises plasma oxidation at a temperature ranging from 400° C. to 500° C.

19. The method of claim 16, wherein the oxidation process removes carbon or nitrogen from the second material of the second layer.

* * * * *